United States Patent
Jost et al.

(10) Patent No.: US 9,899,561 B2
(45) Date of Patent: Feb. 20, 2018

(54) METHOD FOR PRODUCING A COMPOUND SEMICONDUCTOR, AND THIN-FILM SOLAR CELL

(71) Applicant: Saint-Gobain Glass France, Courbevoie (FR)

(72) Inventors: Stefan Jost, München (DE); Robert Lechner, München (DE); Thomas Dalibor, Herrsching am Ammersee (DE); Patrick Eraerds, Vaterstetten (DE)

(73) Assignee: Bengbu Design & Research Institute for Glass Industry, Bengbu (CN)

(*) Notice: Subject to any disclaimer, the term of this patent is extended or adjusted under 35 U.S.C. 154(b) by 0 days.

(21) Appl. No.: 14/651,374

(22) PCT Filed: Dec. 11, 2013

(86) PCT No.: PCT/EP2013/076158
§ 371 (c)(1),
(2) Date: Jun. 11, 2015

(87) PCT Pub. No.: WO2014/095503
PCT Pub. Date: Jun. 26, 2014

(65) Prior Publication Data
US 2015/0318433 A1 Nov. 5, 2015

(30) Foreign Application Priority Data
Dec. 20, 2012 (EP) ..................................... 12198612

(51) Int. Cl.
*H01L 31/18* (2006.01)
*H01L 31/0445* (2014.01)
(Continued)

(52) U.S. Cl.
CPC .... *H01L 31/1864* (2013.01); *H01L 21/02568* (2013.01); *H01L 21/02614* (2013.01);
(Continued)

(58) Field of Classification Search
CPC ............. H01L 31/1864; H01L 31/0445; H01L 21/02568; H01L 21/02614; H01L 31/065; H01L 31/0749
See application file for complete search history.

(56) References Cited

U.S. PATENT DOCUMENTS

| 5,728,231 A | 3/1998 | Negami et al. |
| 2009/0226717 A1 | 9/2009 | Basal |

(Continued)

FOREIGN PATENT DOCUMENTS

| CN | 1719625 A | 1/2016 |
| DE | 10024882 A1 | 11/2001 |

(Continued)

OTHER PUBLICATIONS

Nakada, T., et al., Thin Films of CuInSe2 Produced by Thermal Annealing of Multilayers With Ultra-Thin Stacked Elemental Layers, 10 th E.C. Photovoltaic Solar Energy Conference, Lisbon, Portugal, Apr. 8-12, 1991, pp. 887-890.

(Continued)

*Primary Examiner* — Fernando L Toledo
*Assistant Examiner* — Neil Prasad
(74) *Attorney, Agent, or Firm* — Hodgson Russ LLP

(57) ABSTRACT

The present invention relates to a method for producing a compound semiconductor (2), which comprises the following steps:
Producing at least one precursor layer stack (11), consisting of a first precursor layer (5.1), a second precursor layer (6), and a third precursor layer (5.2), wherein, in a first stage, the first precursor layer (5.1) is produced (Continued)

Figure 1:
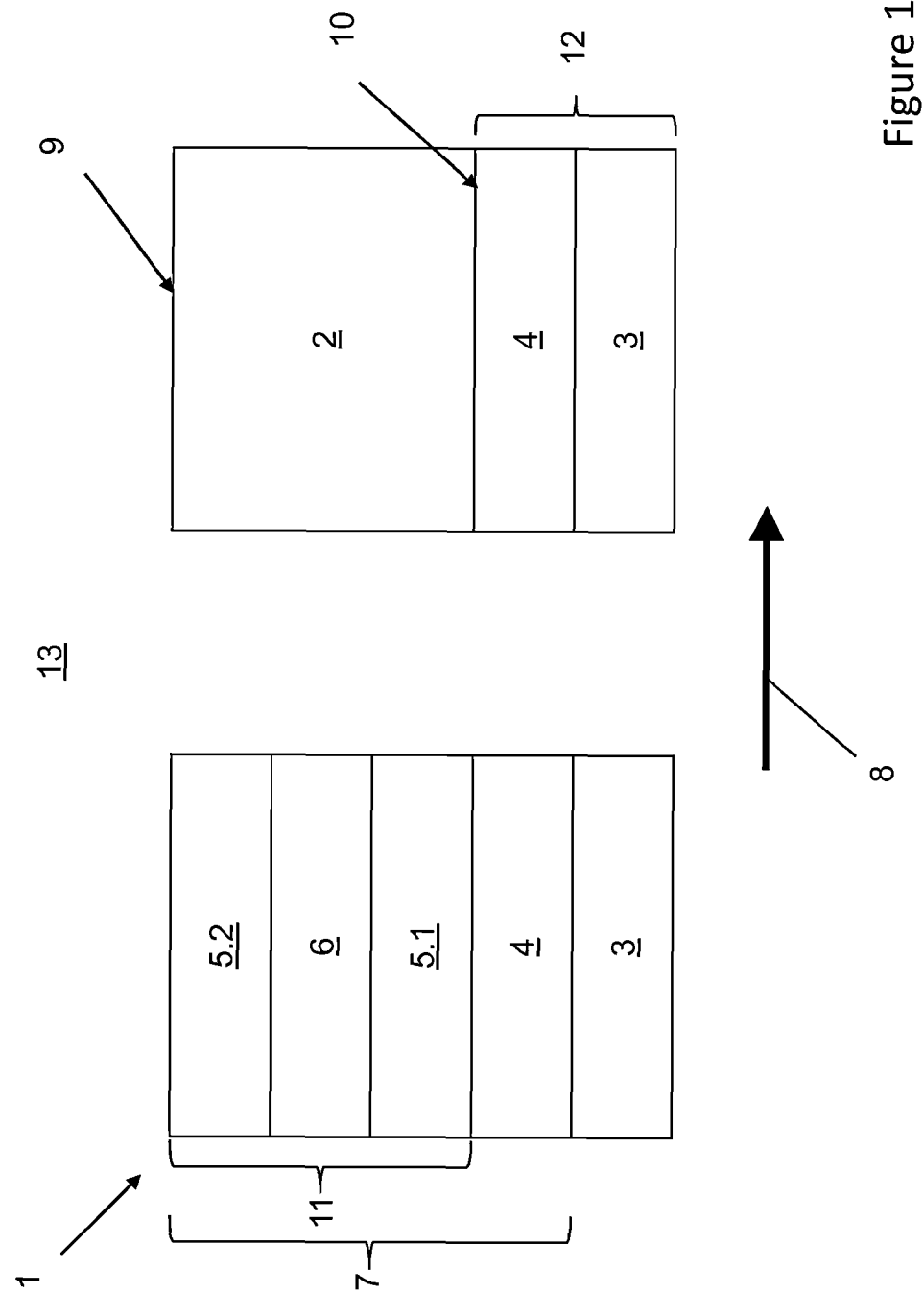

i) Comparative Example 1    ii) Comparative Example 2    iii) Example by depositing the metals copper, indium, and gallium onto a body (12), and, in a second stage, the second precursor layer (6) is produced by depositing at least one chalcogen, selected from sulfur and selenium, onto the first precursor layer (5.1) and, in a third stage, the third precursor layer (5.2) is produced by depositing the metals copper, indium, and gallium onto the second precursor layer (6);

Heat treating the at least one precursor layer stack (11) in a process chamber (13) such that the metals of the first precursor layer (5.1), the at least one chalcogen of the second precursor layer (6), and the metals of the third precursor layer (5.2) are reactively converted to form the compound semiconductor (2).

10 Claims, 13 Drawing Sheets

(51) Int. Cl.
*H01L 31/065* (2012.01)
*H01L 31/0749* (2012.01)
*H01L 21/02* (2006.01)

(52) U.S. Cl.
CPC ........ *H01L 31/0445* (2014.12); *H01L 31/065* (2013.01); *H01L 31/0749* (2013.01)

(56) References Cited

U.S. PATENT DOCUMENTS

| | | | |
|---|---|---|---|
| 2009/0258457 A1* | 10/2009 | Britt | C23C 18/1204 |
| | | | 438/95 |
| 2010/0154872 A1 | 6/2010 | Jun et al. | |
| 2010/0218827 A1 | 9/2010 | Aono et al. | |
| 2011/0005586 A1 | 1/2011 | Aksu et al. | |
| 2011/0226336 A1* | 9/2011 | Gerbi | C23C 14/0623 |
| | | | 136/262 |
| 2012/0003786 A1 | 1/2012 | Aksu et al. | |
| 2012/0098032 A1* | 4/2012 | Guo | H01L 21/02568 |
| | | | 257/184 |
| 2012/0289033 A1 | 11/2012 | Koetschau et al. | |
| 2013/0217177 A1* | 8/2013 | Wong | C23C 16/306 |
| | | | 438/95 |
| 2013/0264526 A1* | 10/2013 | Cao | H01L 21/0237 |
| | | | 252/519.4 |
| 2014/0094025 A1* | 4/2014 | Korevaar | H01L 31/0322 |
| | | | 438/558 |

FOREIGN PATENT DOCUMENTS

| | | |
|---|---|---|
| DE | 102005040087 A1 | 3/2007 |
| DE | 19956735 B4 | 8/2008 |
| EP | 2360720 A1 | 8/2011 |
| EP | 2360721 A1 | 8/2011 |
| EP | 2368860 A1 | 9/2011 |
| JP | H04-212430 | 8/1992 |
| JP | H08-316230 A | 11/1996 |
| JP | H09-213977 A | 8/1997 |
| JP | 2003-318424 A | 11/2003 |
| JP | 3897622 B | 3/2007 |
| JP | 2009-277945 A | 11/2009 |
| JP | 2011-249494 A | 12/2011 |
| JP | 2012-007194 A | 1/2012 |
| JP | 2012-142342 A | 7/2012 |
| WO | 2010/094048 A2 | 8/2010 |
| WO | 2011/028957 A2 | 3/2011 |
| WO | 2012/025607 A1 | 3/2012 |
| WO | 2012/091170 A1 | 7/2012 |
| WO | 2012/143858 A2 | 10/2012 |

OTHER PUBLICATIONS

Palm, J., et al., CIS module pilot processing applying concurrent rapid selenization and sulfurization of large area thin film precursors, Thin Solid Films 731-732, 2003, pp. 414-522.

* cited by examiner

METHOD FOR PRODUCING A COMPOUND SEMICONDUCTOR, AND THIN-FILM SOLAR CELL

The invention is in the technical area of the production of thin-film solar cells and relates to a method for producing a chalcopyrite compound semiconductor as well as a thin-film solar cell with an absorber consisting of a quaternary compound semiconductor $Cu(In,Ga)S_2$, a quaternary compound semiconductor $Cu(In,Ga)Se_2$, or a pentanary compound semiconductor $Cu(In,Ga)(S,Se)_2$.

Thin-film systems for solar cells and solar modules are sufficiently known and available on the market in various designs depending on the substrate and the materials applied thereon. The materials are selected such that the incident solar spectrum is utilized to the maximum. Due to the physical properties and the technical handling qualities, thin-film systems with amorphous, micromorphous, or polycrystalline silicon, cadmium telluride (CdTe), gallium arsenide (GaAs), copper indium (gallium) selenide (Cu(In, Ga)Se$_2$), copper indium (gallium)sulfide ($Cu(In,Ga)S_2$), copper indium (gallium) selenide sulfide $Cu(In,Ga)(S,Se)_2$, and copper zinc tin sulfoselenide (CZTS from the group of the kesterites) as well as organic semiconductors are particularly suited for solar cells. The pentanary semiconductor $Cu(In,Ga)(S,Se)_2$ and the quaternary semiconductors $Cu(In,Ga)Se_2$ and $Cu(In,Ga)S_2$ belong to the group of chalcopyrite semiconductors and are frequently abbreviated as CIS (copper indium diselenide or sulfide) or CIGS (copper indium gallium diselenide, copper indium gallium disulfide, or copper indium gallium disulfoselenide). In the abbreviation, S can represent selenium, sulfur, or a mixture of the two chalcogens.

Various methods for producing chalcopyrite compound semiconductors are described in the literature: Thus, for example, coevaporation of the semiconductor components onto a substrate in a single-stage method is used as is known from DE 10024882 A1 and DE 102005040087 A1.

An alternative method for producing chalcopyrite compound semiconductors consists of a two-stage process. Such two-stage methods are known, for example, from J. Palm et al., "CIS module pilot processing applying concurrent rapid selenization and sulfurization of large area thin film precursors", Thin Solid Films 431-432, pp. 414-522 (2003). Therein, a back electrode made of molybdenum is first applied on a substrate, for example, a glass substrate. The molybdenum layer is, for example, patterned with a laser. Then, various precursor layers made of copper, indium, and gallium are deposited onto the molybdenum layer, for example, by magnetron sputtering. In addition, a selenium layer and/or a sulfur layer is deposited onto the layer sequence by thermal evaporation. The resultant layer structure is heat-treated in a second process. The actual crystal formation and phase conversion of the precursor layers to form the actual semiconductor layer is accomplished by means of the heat treatment.

In contrast, the object of the present invention consists in advantageously improving prior art methods for producing chalcopyrite compound semiconductors and corresponding thin-film solar cells with compound semiconductors.

These and other objects are accomplished according to the proposal of the invention by a method for producing a compound semiconductor, by a compound semiconductor, and a thin-film solar cell with the characteristics of the coordinate claims. Advantageous embodiments of the invention are indicated through the characteristics of the subclaims.

According to the invention, a method for producing a chalcopyrite compound semiconductor is presented, which is advantageously part of a method for producing a thin-film solar cell or a thin-film solar module. Here, and in the following, the term "thin-film solar cell" refers to photovoltaic layer systems with thicknesses of only a few microns. Such layer systems require carrier substrates to provide adequate mechanical stability. Known carrier substrates for thin-film solar cells contain inorganic glass, polymers, or metal alloys and can be configured, depending on the layer thickness and material characteristics, as rigid plates or flexible films.

The method according to the invention comprises the following steps:

A step for generating at least one precursor layer stack, consisting of a first precursor layer, a second precursor layer, and a third precursor layer in three stages: In a first stage, the first precursor layer is produced by depositing the metals copper (Cu), indium (In), and gallium (Ga) onto a body. In a second stage, the second precursor layer is produced by depositing at least one chalcogen, selected from sulfur (S) and selenium (Se), onto the first precursor layer. In a third stage, the third precursor layer is produced by depositing the metals copper (Cu), indium (In), and gallium (Ga) onto the second precursor layer.

Another step for heat treating the at least one precursor layer stack in a process chamber during a first time interval such that the metals of the first precursor layer, the at least one chalcogen of the second precursor layer, and the metals of the third precursor layer are reactively converted to form the pentanary compound semiconductor $Cu(In,Ga)(S,Se)_2$, the quaternary compound semiconductor $Cu(In,Ga)Se_2$, or the quaternary compound semiconductor $Cu(In,Ga)S_2$. Here, the notation "$Cu(In,Ga)(S,Se)_2$" means that the chalcogens sulfur (S) and selenium (Se) are contained in combination in the compound semiconductor. The same applies for the two metals indium (In) and gallium (Ga).

In an advantageous improvement of the method according to the invention, the heat treatment of the at least one precursor layer stack is done in a process gas atmosphere, which contains, at least intermittently, at least one chalcogen, namely sulfur (S) and/or selenium (Se), or at least one chalcogen-containing compound, in which sulfur and/or selenium is contained in bonded form. To this end, one or a plurality of process gases, containing at least one elemental chalcogen, selected from sulfur and selenium, and/or at least one chalcogen-containing compound, in which sulfur and/or selenium is contained in bonded form, for example, hydrogen sulfide ($H_2S$) or hydrogen selenide ($H_2Se$) or other sulfur- or selenium-containing gases, is supplied to the process chamber, at least intermittently, during the heat treatment of the at least one precursor layer stack.

The at least one process gas can be supplied to the process chamber continuously during the first time interval of the heat treatment or, however, only during at least a second time interval, which is shorter than the first time interval. For example, the at least one process gas can be fed into the process chamber in an earlier and/or a later phase of the heat treatment. In particular, it is possible in the method according to the invention for the at least one process gas to be supplied such that the composition of the chalcogen-containing atmosphere in the process chamber changes during the heat treatment in order to thus selectively influence the composition of the compound semiconductor generated.

Advantageously, during the deposition of the second precursor layer, the body has a temperature of less than 150° C., more preferably less than 100° C., by which means, already during the deposition of the precursor materials, an unintended (partial) reaction can be reliably prevented. Both during the deposition of the metals copper, indium, and gallium and during the deposition of the at least one chalcogen, one or a plurality of dopants (for example, sodium or potassium) can be deposited. The same applies to the deposition of the third precursor layer onto the second precursor layer. Also, the dopant addition can also be done as another precursor layer.

In order to influence the crystal quality of the compound semiconductor generated and, in particular, the efficiency of the thin-film solar cell, it can be advantageous, for the deposition of the first precursor layer, for a layer stack made of individual layers of the metals copper, indium, and gallium (with each individual layer consisting of one single metal) to be deposited several times in succession. To this end, it can also be advantageous, for the deposition of the second precursor layer, for a layer stack made of individual layers of the chalcogens sulfur and selenium (with each individual layer consisting of one single chalcogen) to be deposited several times in succession. Likewise, it can be advantageous with regard to the crystal quality if the precursor layer stack is deposited several times in succession.

If the quaternary compound semiconductors $Cu(In,Ga)Se_2$ or $Cu(In,Ga)S_2$ are to be produced by the method according to the invention, it is advantageous for the second precursor layer to be produced by depositing one chalcogen, selected from sulfur and selenium, onto the first precursor layer, wherein, contained in the at least one process gas supplied at least intermittently during the heat treatment, is
  the same chalcogen, selected from sulfur and selenium, as in the second precursor layer, and/or
  a chalcogen-containing compound, selected from a sulfur-containing compound and a selenium-containing compound, with the same chalcogen as in the second precursor layer.

If the pentanary compound semiconductor $Cu(In,Ga)(S,Se)_2$ is to be produced, it is advantageous for the second precursor layer to be produced by depositing one chalcogen, selected from sulfur and selenium, onto the first precursor layer, wherein the respective other chalcogen, selected from sulfur and selenium, than in the second precursor layer and/or a chalcogen compound, selected from a sulfur-containing compound and a selenium-containing compound, with the respective other chalcogen than in the second precursor layer is contained in the at least one process gas supplied at least intermittently during the heat treatment.

On the other hand, it can be advantageous for producing the pentanary compound semiconductor $Cu(In,Ga)(S,Se)_2$ for the second precursor layer to be produced by depositing the two chalcogens sulfur and selenium onto the first precursor layer, wherein sulfur and/or selenium and/or a sulfur-containing compound and/or a selenium-containing compound is contained in the at least one process gas supplied at least intermittently during the heat treatment.

By means of the layer structure according to the invention, a definable or defined gallium depth profile is formed during the production of the quaternary compound semiconductor $Cu(In,Ga)Se_2$ or $Cu(In,Ga)S_2$, or the pentanary compound semiconductor $Cu(In,Ga)(S,Se)_2$. In particular, the gallium depth profile from one surface of the compound semiconductor to an interface with the body can be formed such that the gallium content at the surface of the compound semiconductor has a first maximum value, decreases toward the body interface down to a minimum value, and then increases again, and has a second maximum value at the body interface.

In the context of the present invention, "gallium content" means the atomic ratio of gallium based on the total content of indium and gallium, in other words, Ga/(In+Ga).

An increased gallium content in the chalcopyrite compound semiconductor results in a local increase in the bandgap. In the case of a use of the compound semiconductor as an absorber of a thin-film solar cell, the increase in the bandgap at the interface to the back electrode and at the surface results in an advantageous increase in the open circuit voltage.

Preferably, the gallium depth profile is configured such that an absolute change in the gallium content at least over a portion of the depth profile, i.e., over at least a portion of the layer thickness of the compound semiconductor, in particular from the semiconductor surface to the body interface, is at least 10%, at least 20%, at least 30%, at least 40%, at least 50%, at least 60%, at least 70%, or at least 80%. Particularly preferably, the relative change in the gallium content is at least 20%.

The invention thus presents a novel method for producing compound semiconductors with a double maximum in the gallium content, with one maximum arranged at the interface with the body and a second maximum at the semiconductor surface, in a two-stage method.

In two-stage methods for producing chalcopyrite compound semiconductors according to the prior art, only two precursor layers are used. They are a metallic first precursor layer that is arranged on the back electrode and a second, chalcogen-containing precursor layer that is arranged on the first precursor layer. In order to obtain the desired chalcogenization of the compound semiconductor, an excess of selenium can be used. This means that the atomic ratio of chalcogens applied is greater than the sum of the metals copper, indium, and gallium. Furthermore, a process box that limits the process space around the precursor layer stack and minimizes chalcogen losses during the subsequent heat treatment is frequently used.

The layer structure according to the invention, in which the chalcogen component is arranged in the second precursor layer and is covered by a third metallic precursor layer, has, in contrast, multiple advantages from a process technology standpoint: The bonding of the chalcogen onto the metal precursor is particularly effective such that it is possible under certain circumstances to dispense with the excess of chalcogen known from the prior art and/or the reduction of the process space by means of a process box. Alternatively or in combination, it is also possible to completely or partially dispense with the additional supplying of a chalcogen-containing process gas during the heat treatment.

In an advantageous embodiment of the method according to the invention, a fourth precursor layer, which contains at least one chalcogen, selected from sulfur and selenium, is arranged on the third precursor layer. The fourth precursor layer is preferably designed thinner than the second precursor layer.

This has the particular advantage that, for example, with a second precursor layer made of Se and a fourth precursor layer made of Se, the incorporation of S from a $H_2S$-containing process gas into the compound semiconductor can be controlled particularly well. Moreover, the crystal quality of the compound semiconductor generated can be additionally improved by means of the additional, overlying fourth precursor layer.

It is particularly advantageous for a definable or defined sulfur depth profile to be formed during the production of the pentanary compound semiconductor $Cu(In,Ga)(S,Se)_2$ by means of the at least one process gas. In particular, the sulfur depth profile can be configured from one surface of the compound semiconductor to an interface with the body such that the sulfur content at the semiconductor surface has a maximum value, decreases toward the body interface, and has a minimum value at the body interface; or the sulfur content has a minimum value at the semiconductor surface, increases toward the body interface, and has a maximum value at the body interface; or the sulfur content has a first maximum value at the semiconductor surface, decreases toward the body interface down to a minimum value, and then increases again, and has a second maximum value at the body interface; or the sulfur content has a first minimum value at the semiconductor surface, increases toward the body interface up to a maximum value, and then decreases again, and has a second minimum value at the body interface.

In the context of the present invention, "sulfur content" means the atomic ratio of sulfur based on the total content of selenium and sulfur, in other words, S/(Se+S).

Preferably, the sulfur depth profile is configured such that an absolute change of the sulfur content at least over a portion of the depth profile, i.e., over at least a portion of the layer thickness of the compound semiconductor, in particular from the semiconductor surface to the body interface, is at least 10%, at least 20%, at least 30%, at least 40%, at least 50%, at least 60%, at least 70%, or at least 80%. Particularly preferably, the relative change of the sulfur content is at least 20%.

Thus, it is possible, by means of the method according to the invention, in the heat treatment, to selectively influence the composition of the pentanary compound semiconductor $Cu(In,Ga)(Se,S)_2$ with regard to the sulfur content (based on the total content of selenium and sulfur, i.e., S/(Se+S)). In other words, by means of thermal processing in a chalcogen-containing process atmosphere variable in terms of time and in the concentration of sulfur and/or selenium, the composition of the semiconductor over the layer thickness and thus its bandgap and bandgap profile can be influenced. It is, in particular, possible to produce compound semiconductors with a homogeneous composition with regard to the sulfur content, in which the sulfur content is unchanged over the layer thickness.

Particularly advantageously, a pentanary compound semiconductor with a defined (predetermined) or definable (predeterminable) sulfur depth profile (S/(Se+S)) can be produced, whose sulfur content (based on the total content of selenium and sulfur) varies over the layer thickness. Without being bound to a specific theory, an increase in the efficiency of a thin-film solar cell whose absorber is made of the compound semiconductor is expected as a result.

For example, a sulfur depth profile with a maximum value of the ratio S/(Se+S) at the surface of the absorber and a decreasing value of the ratio S/(Se+S) toward the interface can be set. The thus increased bandgap at the absorber surface results, in the thin-film solar cell, in an increase in the open circuit voltage.

On the other hand, the height of the short-circuit current is determined by the minimum of the bandgap in the interior of the absorber. This can also be set by means of a sulfur depth profile with a maximum value of the ratio S/(Se+S) at the surface of the absorber and a decreasing value of the ratio S/(Se+S) toward the interface.

In combination with the gallium depth profile set, the sulfur depth profile set results in an increase in the efficiency of the thin-film solar cell.

In addition to the setting of a bandgap depth profile, the possibility of increasing the efficiency of the thin-film solar cell through an improvement of the crystal quality of the semiconductor layer exists. For example, it is known from experiments with the material system Cu—In—Ga—Se—S that the different metals have different reaction kinetics with different chalcogens. This results in clear differences in the formation temperature of the different metal-chalcogenide phases and can thus negatively affect the crystal quality of the $Cu(In,Ga)(S,Se)_2$ compound semiconductor. In particular, it can be assumed that, in the heating process, the chalcogenization of the Cu—In—Ga precursor layers can be influenced by a modified chalcogen gas atmosphere (Se/S composition). Thus, differences in the chalcogenization kinetics can be compensated by a temporally modified process gas atmosphere (Se/S composition). It is expected that the crystal quality and the efficiency can be positively influenced by this.

In the method according to the invention, the first precursor layer and the third precursor layer can, in principle, be implemented such that the copper content is less than the total content of indium and gallium, or the copper content is the same as the total content of indium and gallium, or the copper content is greater than the total content of indium and gallium.

In the context of the present invention, "copper content" means the atomic ratio of copper based on the total content of indium and gallium, i.e., Cu/(In+Ga).

On the other hand, the first precursor layer can, in principle, be implemented such that the indium content is less than the gallium content, or the indium content is the same as the gallium content, or the indium content is greater than the gallium content.

In the context of the present invention, "indium content" means the atomic ratio of indium based on the total content of indium and gallium, i.e., In/(In+Ga).

Particularly advantageously, the first precursor layer is implemented such that the copper content is less than the total content of indium and gallium and, at the same time, the gallium content is less than the indium content, with the assumption that, by this measure, a favorable influence on the crystal quality and the efficiency of the thin-film solar cell can be obtained.

In another advantageous embodiment of the method according to the invention, for producing the pentanary compound semiconductor $Cu(In,Ga)(S,Se)_2$, the three precursor layers are implemented such that the atomic ratio of the total content of chalcogen(s) to the total content of metals is greater than or equal to 1. By this measure as well, a favorable influence on the crystal quality and the efficiency of the thin-film solar cell can be obtained.

The invention further extends to a thin-film solar cell with an absorber made of a quaternary compound semiconductor $Cu(In,Ga)Se_2$, a quaternary compound semiconductor $Cu(In,Ga)S_2$, or a pentanary compound semiconductor $Cu(In,Ga)(S,Se)_2$ on a body, with the absorber having, from a semiconductor surface toward a body interface, a definable or defined gallium depth profile (based on a total content of gallium and indium).

The compound semiconductor of the absorber is advantageously produced by the method as described above.

In the thin-film solar cell according to the invention, the gallium depth profile is implemented such that the gallium content at the surface of the absorber has a first maximum value, decreases toward the interface with the body and thus to the back electrode down to a minimum value, and then increases again, and has a second maximum value at the interface.

An increased gallium content in the chalcopyrite compound semiconductor results in a local increase in the bandgap. The increase in the bandgap at the interface with the back electrode and at the surface results in an advantageous increase of the open-circuit voltage in the thin-film solar cell.

In an advantageous improvement of the absorber according to the invention, the gallium depth profile is implemented such that a relative change in the gallium content at least over a portion of the depth profile is at least 10%, at least 20%, at least 30%, at least 40%, at least 50%, at least 60%, at least 70%, or at least 80%. Changes in the gallium content in this range are particularly advantageous for the open-circuit voltage and the efficiency of the thin-film solar cell.

In an advantageous embodiment of the thin-film solar cell according to the invention, the absorber is made of the pentanary compound semiconductor $Cu(In,Ga)(S,Se)_2$, with the absorber having, from one semiconductor surface toward a body interface, a definable or defined sulfur depth profile (based on a total content of selenium and sulfur) and the sulfur depth profile being implemented such that the sulfur content at the semiconductor surface has a maximum value, decreases toward the body interface, and has a minimum value at the body interface; or the sulfur content at the semiconductor surface has a minimum value, increases toward the body interface, and has a maximum value at the body interface; or the sulfur content at the semiconductor surface has a first maximum value, decreases toward the body interface down to a minimum value, and then increases again, and has a maximum value at the body interface; or the sulfur content has a first minimum value at the semiconductor surface, increases toward the body interface up to a maximum value, and then decreases again, and has a second minimum value at the body interface.

Preferably, the sulfur depth profile is implemented such that a relative change in the sulfur content at least over a portion of the depth profile, i.e., over at least a portion of the layer thickness of the compound semiconductor, in particular, from the semiconductor surface to the body interface, is at least 10%, at least 20%, at least 30%, at least 40%, at least 50%, at least 60%, at least 70%, or at least 80%. Particularly preferably, the relative change of the sulfur content is at least 20%.

As already explained above, an increased gallium content in the chalcopyrite compound semiconductor results in a local increase in the bandgap. In a use of the compound semiconductor as an absorber of a thin-film solar cell, the increase in the bandgap at the interface with the back electrode and at the surface results in an advantageous increase of the open-circuit voltage. On the other hand, the height of the short-circuit current is determined by the minimum of the bandgap in the interior of the absorber. By means of a sulfur depth profile with a minimum in the center of the absorber, the bandgap in the interior of the absorber is reduced, which increases the strength of the short-circuit current. In combination with the gallium depth profile set, such a sulfur depth profile results in an optimized adaptation of the band gradient toward the surface (and thus toward the buffer layer) and toward the interface (and thus toward the back electrode) and thus to a particularly advantageous increase in the efficiency of the thin-film solar cell.

Another aspect of the invention extends to the use of a method as described above for producing a chalcopyrite compound semiconductor of the type $Cu(In,Ga)Se_2$, $Cu(In,Ga)S_2$, or $Cu(In,Ga)(S,Se)_2$ for producing the absorber of a thin-film solar cell or a thin-film solar module.

It is understood that the various embodiments of the invention can be realized individually or in any combination. In particular, the characteristics mentioned above and to be explained in the following can be used not only in the combinations indicated, but also in other combinations or alone without departing from the scope of the present invention.

Figure 2A:
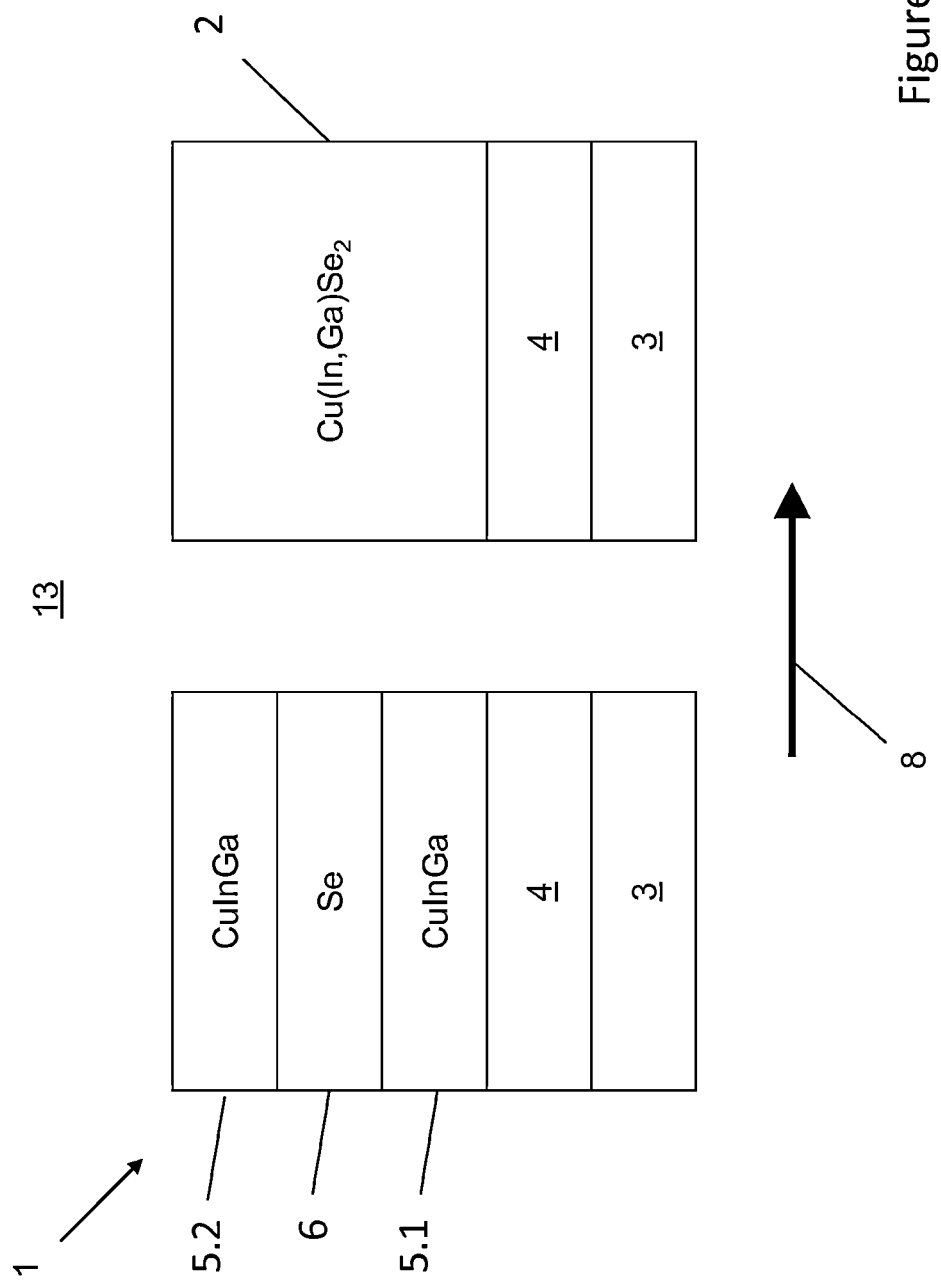
Figure 2B:
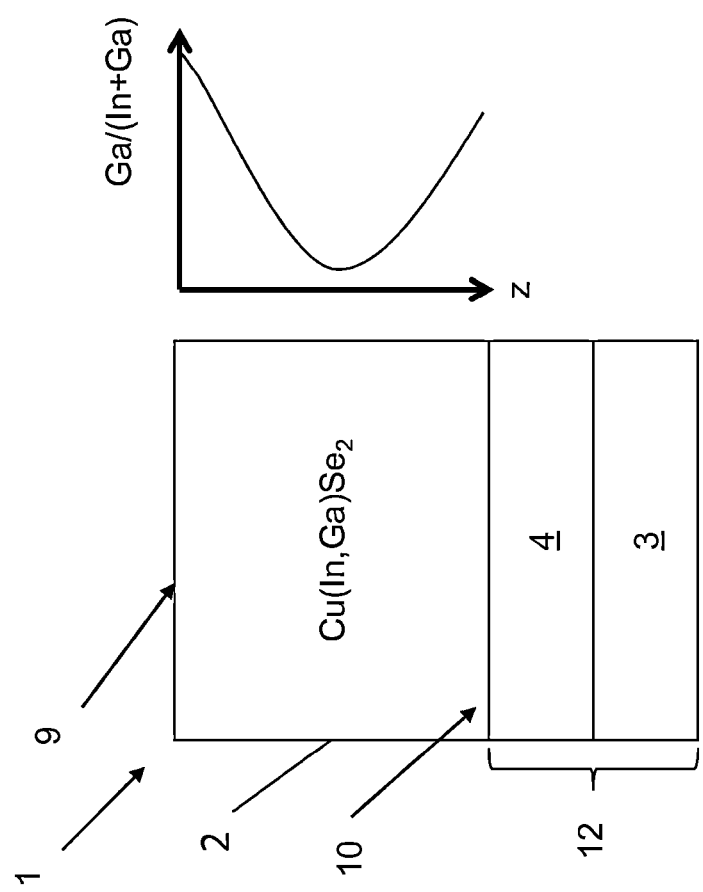
Figure 3A:
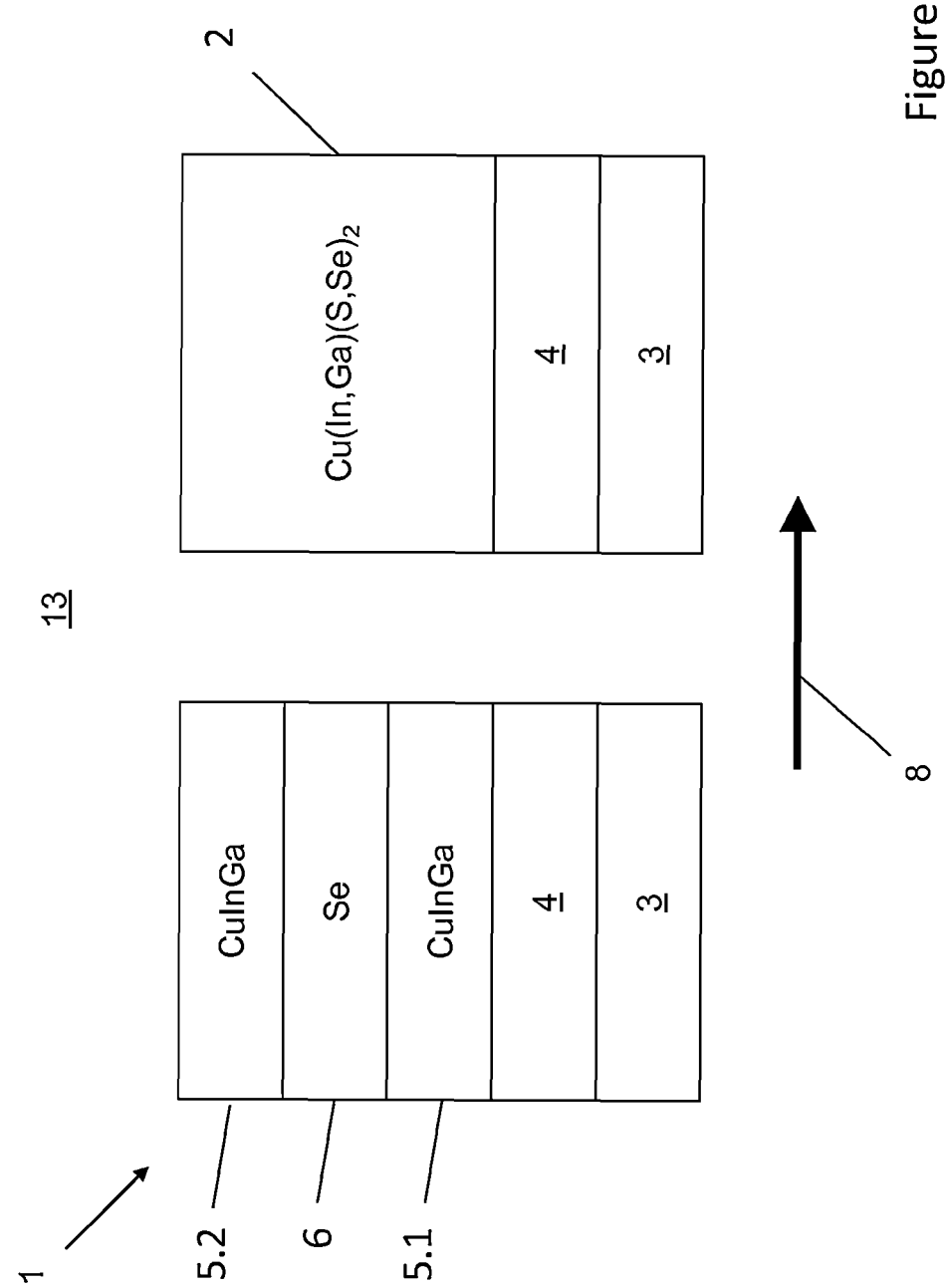
Figure 3B:
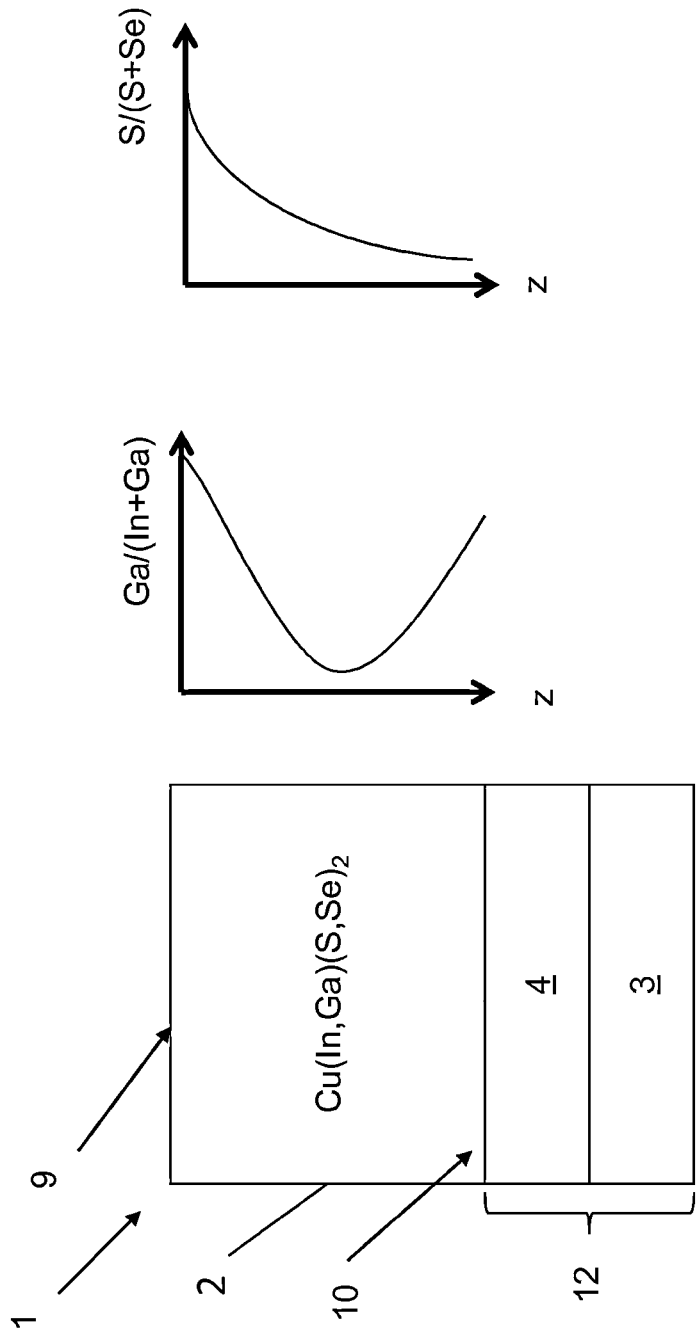
Figure 3C:
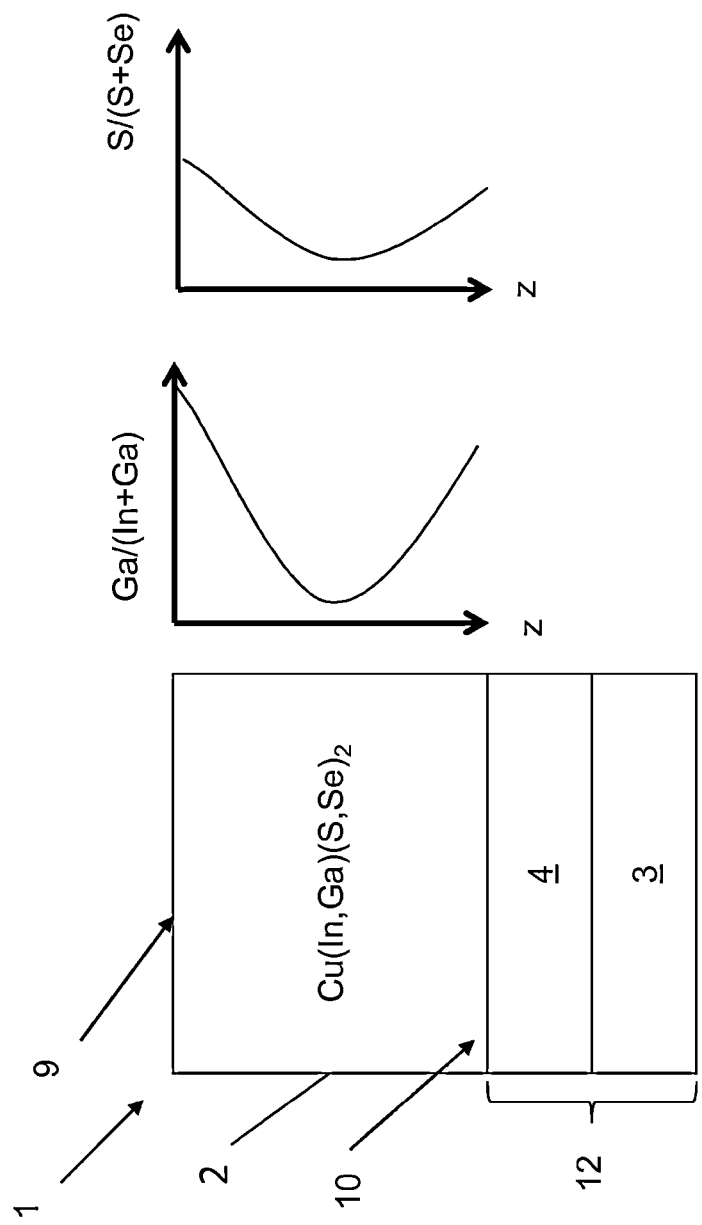
Figure 4A:
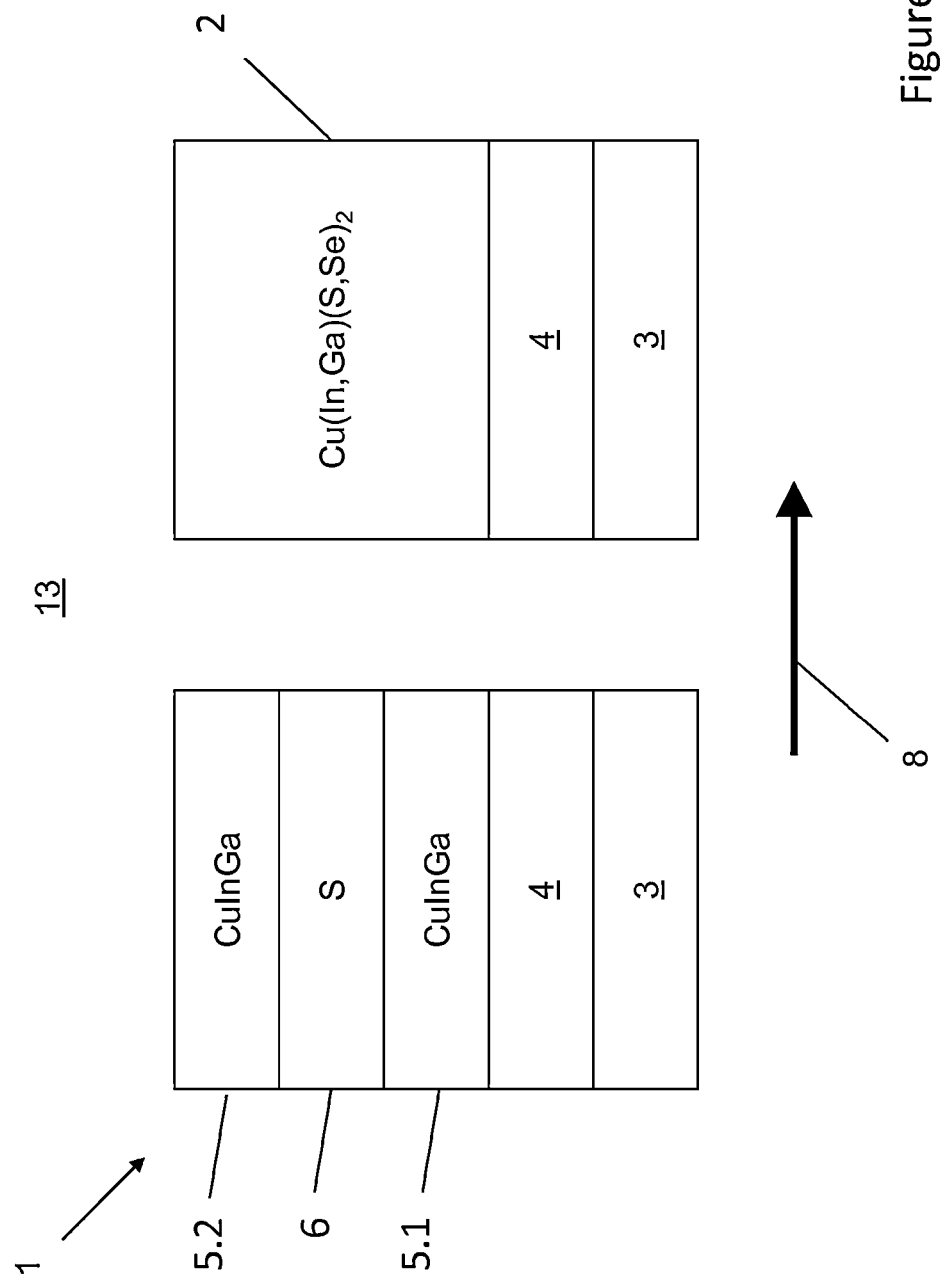
Figure 4B:
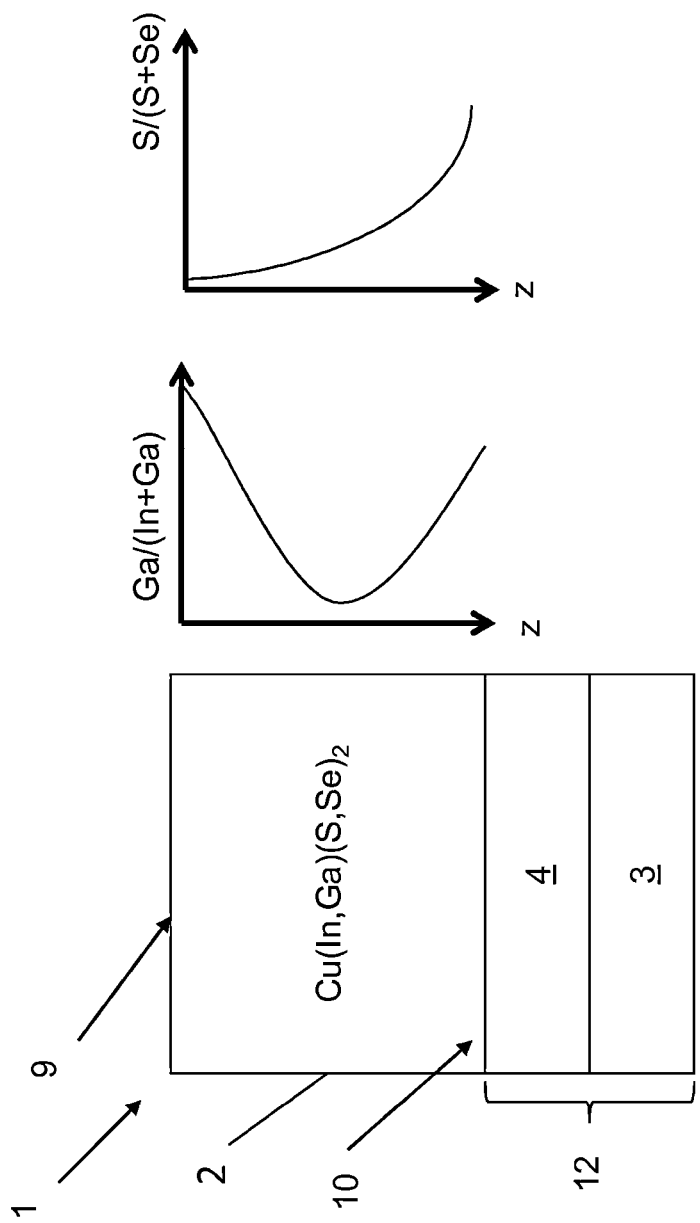
Figure 5A:
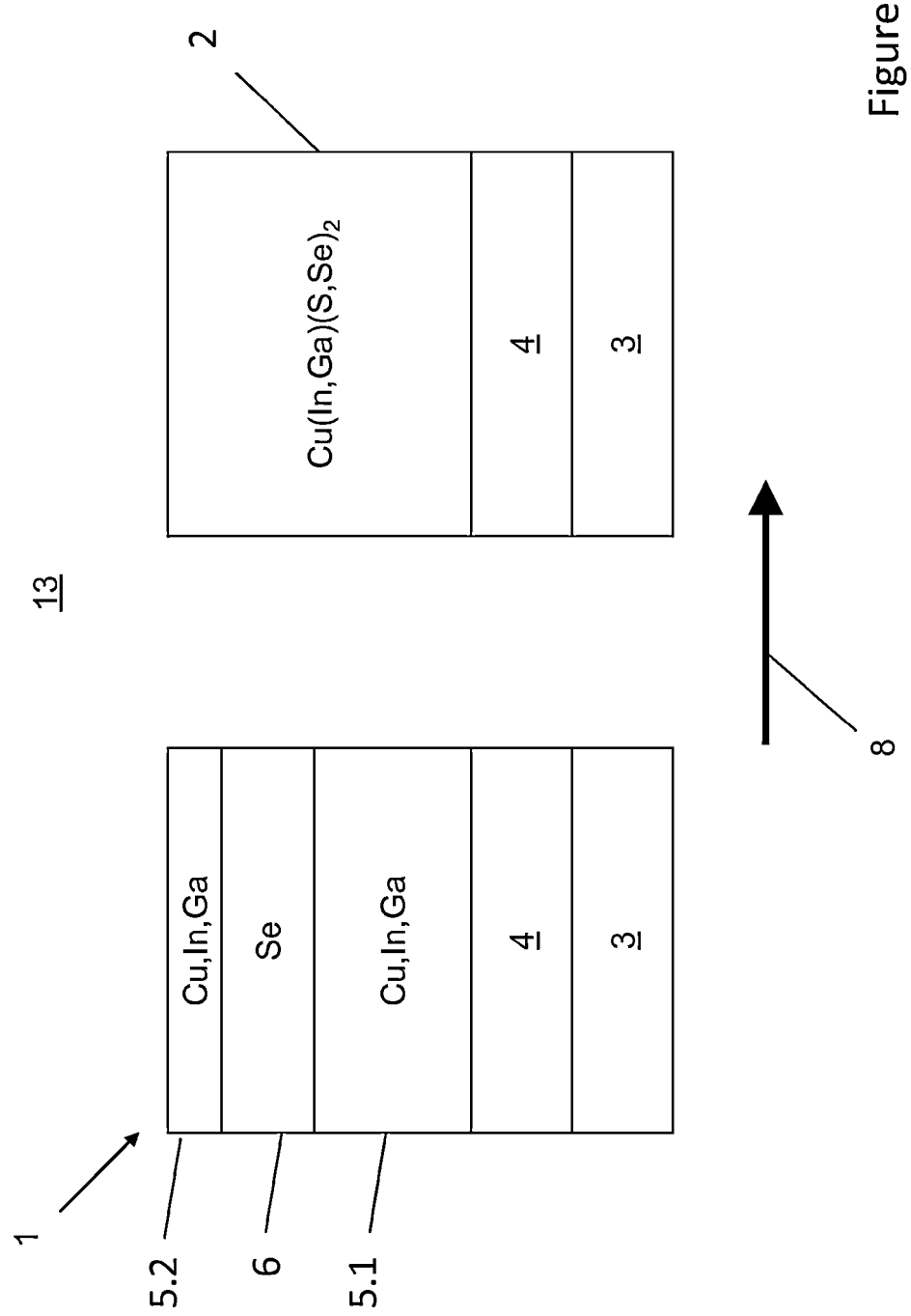
Figure 5B:
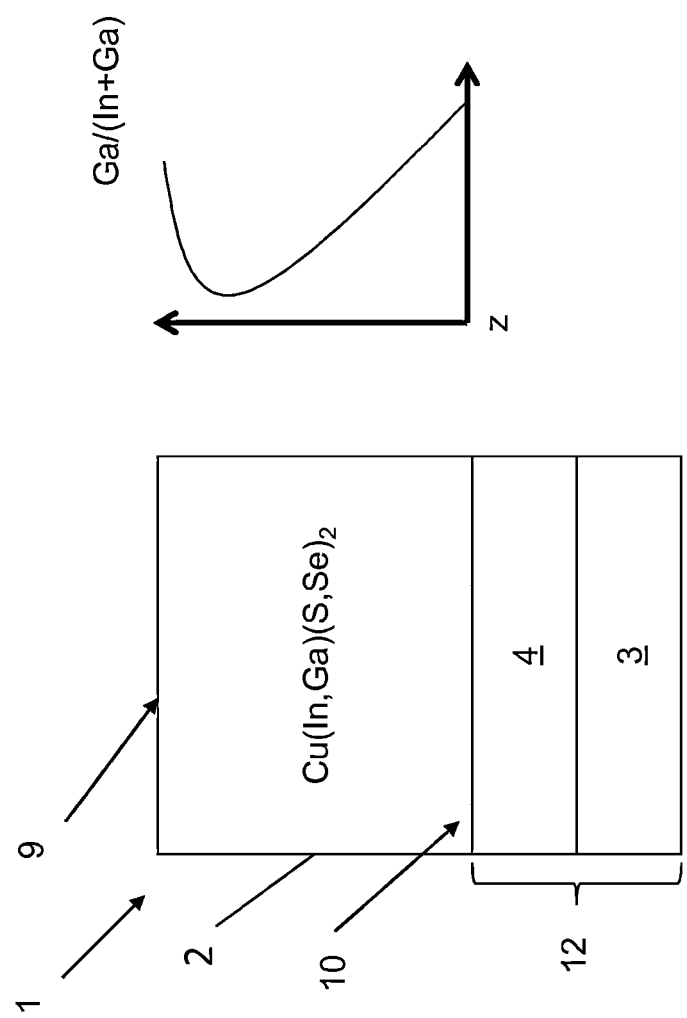
Figure 6:
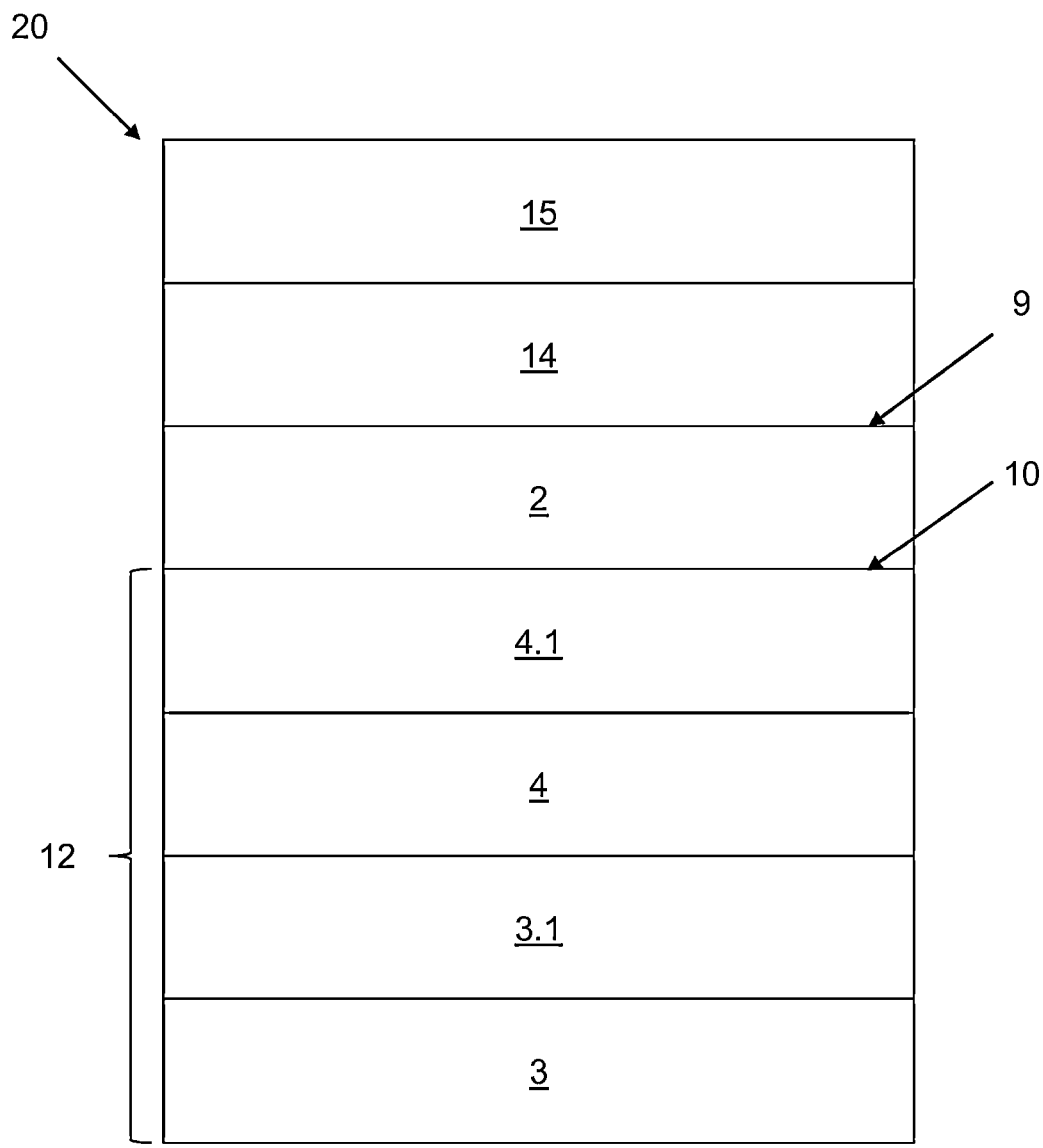
Figure 7:
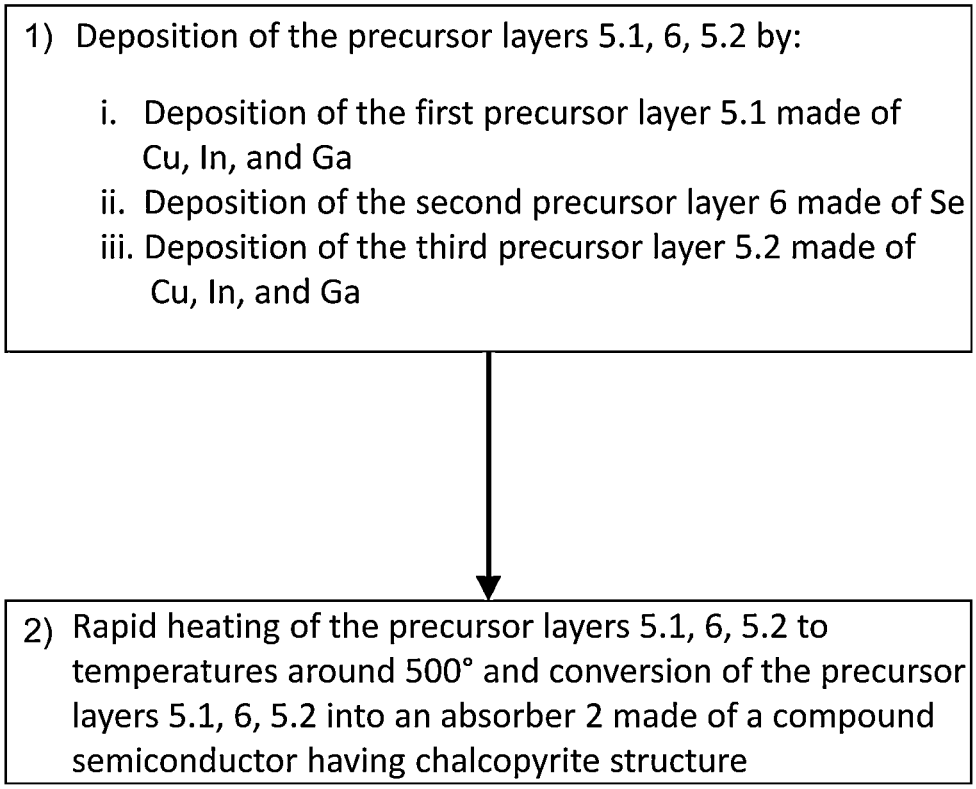
Figure 8:
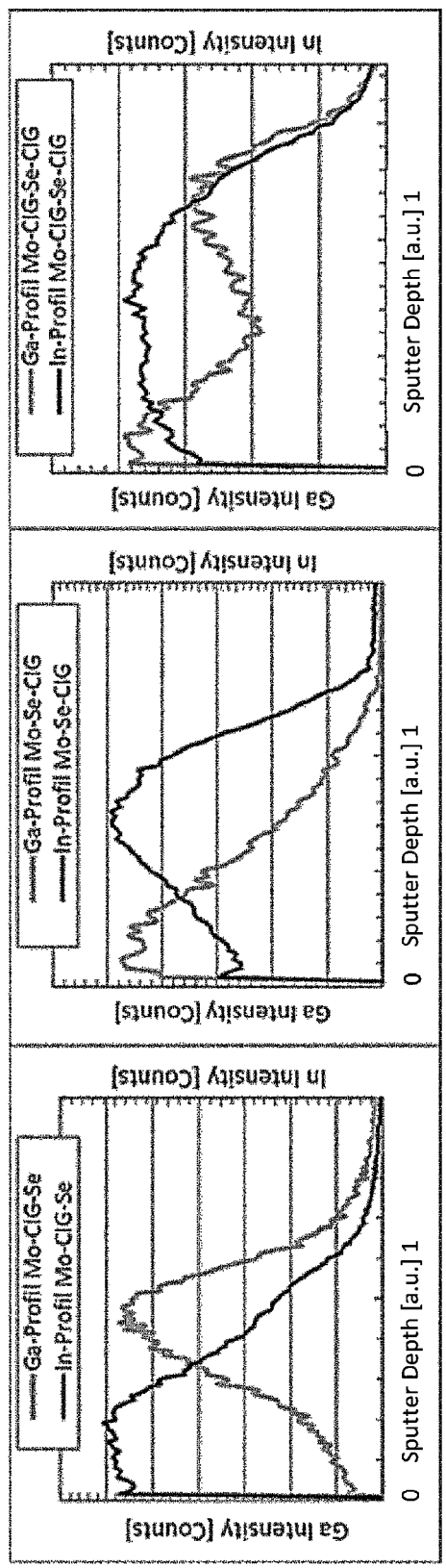

The invention is now explained in detail with reference to exemplary embodiments and to the accompanying figures. They depict in simplified representation, not to scale:

FIG. 1 sectional views to illustrate the general method for producing a chalcopyrite compound semiconductor according to the invention, FIG. 2A sectional views to illustrate specific procedures for producing the quaternary compound semiconductor $Cu(In,Ga)Se_2$, FIG. 2B a sectional view of the quaternary compound semiconductor $Cu(In,Ga)Se_2$ with the gallium depth profile along the absorber, FIG. 3A sectional views to illustrate specific procedures for producing the pentanary compound semiconductor $Cu(In,Ga)(S,Se)_2$, FIG. 3B a sectional view of the pentanary compound semiconductor $Cu(In,Ga)(S,Se)_2$ with the gallium depth profile and the sulfur depth profile along the absorber, FIG. 3C a sectional view of an alternative pentanary compound semiconductor $Cu(In,Ga)(S,Se)_2$ with the gallium depth profile and the sulfur depth profile along the absorber, FIG. 4A sectional views to illustrate specific procedures for producing an alternative pentanary compound semiconductor $Cu(In,Ga)(S,Se)_2$, FIG. 4B a sectional view of the pentanary compound semiconductor $Cu(In,Ga)(S,Se)_2$ with the gallium depth profile and the sulfur depth profile along the absorber, FIG. 5A sectional views to illustrate specific procedures for producing an alternative pentanary compound semiconductor $Cu(In,Ga)(S,Se)_2$, FIG. 5B a sectional view of the pentanary compound semiconductor $Cu(In,Ga)(S,Se)_2$ with the gallium depth profile along the absorber, FIG. 6 a sectional view of a thin-film solar cell according to the invention, FIG. 7 an exemplary embodiment of the process steps according to the invention with reference to a flowchart, FIG. 8 a diagram of the depth profile of the gallium and indium content of an absorber according to the invention with comparative examples.

FIG. 1 depicts schematic sectional views of a general method for producing a light-absorbing compound semiconductor layer, referred to in the following as absorber 2, in a layer structure of a thin-film solar cell designated as a whole with the reference character 1. It is understood that the layer structure 1 can be used for producing a plurality of thin-film solar cells that are connected to each other in series in a large-scale arrangement in a monolithically integrated manner.

The layer structure 1 has, in this case, a substrate configuration, in which a layer structure 7 consisting of a plurality of thin layers is applied onto a (carrier) substrate 3. The substrate 3 is made here, for example, of an inorganic glass, with it equally possible to use other insulating materials with adequate strength as well as inert behavior relative to the process steps performed during the production of the thin-film solar cell. Other examples for this are plastics, in particular polymers or metals, in particular metal alloys. Depending on the layer thickness and the specific material properties, the substrate 3 can be designed as a rigid plate or a flexible film. In the present exemplary embodiment, the layer thickness of the substrate 3 is, for example, 1 to 5 mm.

The layer structure 7 applied on the substrate 3 comprises a back electrode layer 4, which is arranged on a light-entry-side surface of the substrate 3 and is made, for example, of an opaque metal. The back electrode layer 4 can, for example, be deposited on the substrate 3 by vapor deposition or magnetic field-assisted cathodic sputtering (sputtering). The back electrode layer 4 is made, for example, of molybdenum (Mo), aluminum (Al), copper (Cu), titanium (Ti), or of a multilayer system with such a metal, for example, molybdenum (Mo). The layer thickness of the back electrode layer 4 is, in this case, less than 1 μm, preferably in the range from 300 nm to 600 nm and is, for example, roughly 500 nm. The back electrode layer 4 serves as a back-side contact or back electrode of the thin-film solar cell. An alkali barrier, made, for example, of $Si_3N_4$, SiON, or SiCN, can be arranged between the substrate 3 and the back electrode layer 4. The back electrode 4 can be a multilayer system, in which a titanium nitride layer is arranged between, for example, a copper layer and a molybdenum layer. Such back electrodes made of multilayer systems are known, for example, from EP 2 369 634 A2. This is not shown in detail in FIG. 1.

A first precursor layer 5.1, a second precursor layer 6, and a third precursor layer 5.2 are successively arranged on the back electrode layer 4. The three precursor layers 5.1, 6, 5.2 can be reactively converted by a heat treatment indicated by means of arrow 8 into the photovoltaicly active absorber 2. The layer thickness of the absorber 2 is, for example, in the range from 0.5-5 μm and is, in particular, roughly 2 μm.

The layer structure 1 depicted in FIG. 1 represents an intermediate product in the production of a thin-film solar cell. The further processing of the layer structure 1 is unnecessary for the understanding of the invention such that it need not be dealt with in detail. It is merely also indicated that above the absorber 2, a front electrode layer that serves as the front-side contact and is transparent to radiation in the visible spectral range ("window layer") is formed. As a rule, a doped metal oxide (TCO=transparent conductive oxide) is used for the front electrode layer, for example, n-conductive aluminum (Al)-doped zinc oxide (ZnO), boron (B)-doped zinc oxide (ZnO), or gallium (Ga)-doped zinc oxide (ZnO). As a rule, a thin buffer layer, which is, for example, made of CdS, $In_xS_y$, $(In,Ga,Al)_x(S,Se)_y$, ZnS, Zn(O,S), Zn(Mg,O), optionally in combination with intrinsic i-ZnO, is arranged between the absorber 2 and the front electrode layer. By means of the buffer layer, an improved adaptation of the front electrode layer to the absorber 2 can be obtained with regard to the lattice constant and the band gradient. Front electrode, buffer, absorber, and back electrode layer form together a heterojunction, i.e., a sequence of layers of opposite conductor type. The layer thickness of the front electrode layer is, for example, roughly 300 nm to 1500 nm, that of the buffer layer, for example, roughly 50 nm. For protection against environmental influences, a plastic layer (encapsulation film) made, for example, of polyvinyl butyral (PVB), ethylene vinyl acetate (EVA), or DNP can be applied to the front electrode layer. In addition, a cover plate transparent to sunlight that is made, for example, from extra white glass (front glass) with a low iron content and has a thickness of, for example, 1 to 4 mm, can be provided.

The structure of a thin-film solar cell or a thin-film solar module described is known to the person skilled in the art from commercially available thin-film solar cells as well as, for example, from DE 19956735 B4.

In the substrate configuration depicted in FIG. 1, the back electrode layer 4 is adjacent the substrate 3. It is understood that the layer structure 1 can also have a superstrate configuration, wherein the substrate 3 is transparent and the front electrode layer is arranged on a surface of the substrate 3 facing away from the light-entry-side.

As already mentioned, the layer structure 1 can serve for integratedly producing thin-film solar cells connected in series, wherein the layer structure 1 is patterned in a manner known per se by various patterning lines ("P1" for back electrode, "P2" for contact front electrode/back electrode, and "P3" for separating the front electrode). Alternatively, a structure of the thin-film solar cells can be provided with front electrode and grid.

The method illustrated in FIG. 1 is used for producing the absorber 2, which consists of a light-absorbing thin-film semiconductor layer of the type chalcopyrite compound semiconductor. The absorber 2 is made in particular of the quaternary compound semiconductor $Cu(In,Ga)Se_2$, the quaternary compound semiconductor $Cu(In,Ga)S_2$, or the pentanary compound semiconductor $Cu(In,Ga)(S,Se)_2$.

The first precursor layer 5.1 and the third precursor layer 5.2 are made of the metals Cu, In, and Ga and are preferably deposited from pure metal sources onto the back electrode layer 4 or onto a (multilayer) body 12, consisting of substrate 3 and back electrode layer 4 (as well as, optionally, other layers). Deposition of the metals Cu, In, and Ga onto the body 12 can be realized, in particular, by the methods mentioned in the following, with, optionally, one or a plurality of dopants such as Na possibly being supplied. These are typically vacuum coating methods in which a solid or liquid material is converted into the gas phase by energy input and condensed on the body 12 (PVD=physical vapor deposition).

Examples of typical deposition methods of the metals Cu, In, and Ga are:

sputtering of the elements Cu, In, Ga from targets in which these metals are contained in elemental form (element targets). Preferably, the element targets have in each case a purity of ≥4N, more preferably ≥5N.

sputtering of the elements Cu, In, Ga from targets in in which binary and/or ternary alloys of these metals are contained (alloy targets), for example, CuIn, CuGa, GaIn, or CuInGa and/or combinations thereof. Preferably, the alloy targets have in each case a purity of ≥4N, more preferably ≥5N. Optionally, the elements Cu, In, Ga can be additionally sputtered from element targets in order to adjust the composition (stoichiometry) of the first precursor layer 5.1 or in the third precursor layer 5.2 as desired.

thermal evaporation, electron-beam evaporation, or laser material ablation of the elements Cu, In, Ga from sources in which these metals are contained in elemental form (element sources). Preferably, the element sources have in each case a purity of ≥4N, more preferably ≥5N.

thermal evaporation, electron-beam evaporation, or laser material ablation of the elements Cu, In, Ga from sources in which binary and/or ternary alloys of these metals are contained (alloy sources), for example, Cu—In, Cu—Ga, In—Ga or Cu—In—Ga and/or combinations thereof. Preferably, the alloy sources have in each case a purity of ≥4N, more preferably 5N. Optionally, the elements Cu, In, Ga can be additionally deposited from element sources, in order to adjust the composition (stoichiometry) of the first precursor layer 5.1 or of the third precursor layer 5.2 as desired.

electrochemical deposition of Cu, In, and Ga, individually or in alloys or in compounds.

In the case of deposition of the metals Cu, In, Ga using element targets or element sources, the first precursor layer 5.1 and/or the third precursor layer 5.2 comprises multiple metallic individual layers, wherein each individual layer is made of Cu, In, or Ga. For example, the individual layers can be deposited in the layer sequence Cu/In/Ga, but with other layer sequences also possible. In a preferred embodiment, a layer sequence, consisting of individual layers of the metals Cu, In, Ga, for example, Cu/In/Ga, is deposited several times in succession such that the first precursor layer 5.1 and/or the third precursor layer 5.2 consists of a stack of n identical or different layer sequences (for example, n×Cu/In/Ga). Preferably, 2 to 20 layer sequences are deposited in succession (n=2 to 20).

In the case of deposition of the metals Cu, In, Ga using alloy targets or alloys sources, the first precursor layer 5.1 and/or the third precursor layer 5.2 comprises one or a plurality of metal individual layers, which are made of a binary or ternary alloy of the elements Cu, In, and/or Ga.

If, additionally, deposition is done from element targets or element sources, the individual layers can also include elemental Cu, In, and/or Ga. The metallic individual layers can be deposited in a defined layer sequence. In a preferred embodiment, a layer sequence consisting of individual layers made of binary or ternary alloys of the metals Cu, In, and/or Ga (as well as, optionally, elemental Cu, In, and/or Ga) are deposited several times in succession such that the first precursor layer 5.1 and/or the third precursor layer 5.2 consists of a stack of n identical or different layer sequences. Preferably, 2 to 20 layer sequences are deposited in succession (n=2 to 20).

In the layer structure 1, the first precursor layer 5.1 and/or the third precursor layer 5.2 can be implemented such that their composition is copper poor, which means that the copper content is less than the total content of In and Ga(Cu/(In+Ga)<1), or alternatively is stoichiometric, which means that the copper content is equal to the total content of In and Ga (Cu/(In+Ga)=1), or alternatively is copper rich, which means that the copper content is greater than the total content of In and Ga (Cu/(In+Ga)>1).

All three variants in terms of the copper content can be provided in the method according to the invention.

Furthermore, in der layer structure 1, the first precursor layer 5.1 and/or the third precursor layer 5.2 can be implemented such that their composition is indium poor, which means that the indium content is less than the gallium content (In/Ga<1), or alternatively is stoichiometric, which means that the indium content is equal to the gallium content (In/Ga=1), or alternatively is indium rich, which means that the indium content is greater than the gallium content (In/Ga>1).

All three variants in terms of the indium content can be provided in the method according to the invention. Each variant in terms of the copper content can be combined with each variant in terms of the indium content. In view of particularly good efficiency of the thin-film solar cell, it is preferable, according to the invention, for the first precursor layer 5.1 and/or the third precursor layer 5.2 to be implemented such that their composition is copper poor (Cu/(In+Ga)<1) and is, at the same time, indium rich (In/Ga>1). For example, the absorber 2 can, to this end, have a copper content of 0.8 based on the total content of indium and gallium (Cu/(In+Ga)=0.8) and an indium content of 1.22 based on gallium (In/Ga=1.22).

The second precursor layer 6 is deposited on the first precursor layer 5.1. The second precursor layer 6 is made of at least one chalcogen, namely, S and/or Se. The at least one chalcogen is deposited without metallic components. Preferably, the temperature of the substrate 3 during the deposition of the at least one chalcogen is lower than 150° C., particularly preferably lower than 100° C., as a result of which, advantageously, an already beginning partial reaction of the metals of the first precursor layer 5.1 with the at least one chalcogen of the second precursor layer 6 can be prevented.

The deposition of S and/or Se can, for example, be realized by the methods mentioned in the following, wherein, in all methods, one or a plurality of dopants such as Na can optionally be supplied:

thermal evaporation of S and/or Se (sequentially or simultaneously) from one or two evaporation sources, optionally with the addition of dopant such as Na by evaporation of the dopant or a dopant-containing compound.

sputtering from targets, in which the respective chalcogen (S or Se) is contained in elemental form (element targets).

The three precursor layers 5.1, 6, 5.2 together form a precursor layer stack 11. According to the invention, it can be advantageous for the precursor layer stack 11 to be deposited several times in succession. This measure can be advantageous, in particular for the crystal formation and/or setting of a desired depth profile of sulfur (based on the total chalcogen quantity) of the pentanary compound semiconductor Cu(In,Ga)(S,Se)$_2$. According to one embodiment of the method according to the invention, it can be preferable for the three precursor layers 5.1, 6, 5.2 to have a composition such that the ratio chalcogen(s)/metals is greater than or equal to 1.

As indicated schematically in FIG. 1 by the arrow 8, the three precursor layers 5.1, 6, 5.2 are subjected to a heat treatment in the form of rapid thermal processing (RTP), by means of which a reactive conversion of the metals Cu, In, Ga, and the at least one chalcogen S and/or Se is effected to form the quaternary compound semiconductor Cu(In,Ga)Se$_2$ or Cu(In,Ga)S$_2$ or pentanary compound semiconductor Cu(In,Ga)(S,Se)$_2$.

The heat treatment of the three precursor layers 5.1, 6, 5.2 is advantageously carried out at least intermittently in a chalcogen-containing atmosphere inside a process chamber 13 containing the layer structure 1, wherein, depending on the compound semiconductor to be generated, one or a plurality of process gases (sulfur and/or selenium and/or hydrogen sulfide (H$_2$S) and/or hydrogen selenide (H$_2$Se) or combinations thereof) are supplied to the process chamber 13 in a controlled manner. Each process gas is supplied during at least one (predetermined) time interval during the heat treatment, with the time interval being shorter than the time of the entire heat treatment or equal to the time of the entire heat treatment. The amount of each process gas supplied per time unit can be unchanged or can vary during the addition. In particular, the composition of the chalcogen-containing atmosphere can be unchanged or can vary during the heat treatment.

The heat treatment requires:
fast heat-up rates in the range of a few cal/s,
maximum temperatures above 400° C., preferably above 500° C.,
high temperature homogeneity over the substrate surface (laterally) and layer thickness.
assurance of a sufficiently high, controllable, and reproducible partial pressure of the at least one chalcogen (Se and/or S) during the thermal processing (avoidance of Se and/or S losses),
optionally, a controllable process gas supply, of, for example, $H_2$, $N_2$, Ar, S-Gas, Se-Gas, $H_2S$, $H_2Se$, and combinations thereof, with suitable gas temperature/time profiles.

The heat treatment of the three precursor layers 5.1, 6, 5.2 can be done, for example, using a process box accommodating the layer structure 1, in a tunnel, or inside a process hood surrounding the layer structure 1. For the performance of the heat treatment, one or a plurality of layer structures 1 with parallel substrates 3 can be arranged next to or above each other (dual substrates or multilevel process), as is known from EP 2360720 A1, EP 2360721 A1, EP 2368860 A1, and WO 2012/025607 A1.

For production of the pentanary compound semiconductor $Cu(In,Ga)(S,Se)_2$, the heat treatment of the three precursor layers 5.1, 6, 5.2 is preferably performed using a controlled temperature process gas profile such that the ratio S/(Se+S), i.e., the sulfur content based on the total contents of S and Se, in the absorber 2 has a defined depth profile.

The term "(sulfur-) depth profile" refers to the sulfur content or curve of the value of the quotient S/(Se+S) in the absorber 2 along a linear dimension of the absorber 2, starting from a surface 9 of the absorber 2 facing away from the substrate 3 to an interface 10 facing the substrate 3 in a direction perpendicular to the stack sequence of the layer structure 7 or in the direction of the layer thickness.

According to a first variant, the heat treatment (RTP processing) is performed such that the sulfur depth profile over the layer thickness has a decreasing curve, i.e., the value of the ratio S/(Se+S) has its maximum maximum at the surface 9 and decreases from the surface 9 toward the interface 10 such that the value of the ratio S/(Se+S) has its minimum at the interface 10.

According to a second variant, the heat treatment (RTP processing) is performed such that the sulfur depth profile over the layer thickness has an increasing curve, i.e., the value of the ratio S/(Se+S) has its minimum at the surface 9 and increases from the surface 9 toward the interface 10 such that the value of the ratio S/(Se+S) has its maximum at the interface 10.

According to a third variant, the heat treatment (RTP processing) is performed such that the sulfur depth profile over the layer thickness first has a decreasing curve and then an increasing curve. In other words, the value of the ratio S/(Se+S) has a first maximum value at the surface 9, initially decreases from the surface 9 toward the interface and assumes, between the surface and interface 9, 10, a (single) minimum value, and then increases again such that the value of the ratio S/(Se+S) assumes a second maximum value at the interface 10, where the second maximum value can be equal to the first maximum value, but is, as a rule, different.

According to a fourth variant, the heat treatment (RTP processing) is performed such that the sulfur depth profile over the layer thickness initially has an increasing and then a decreasing curve, i.e., the value of the ratio S/(Se+S) has, at the surface 9, a first minimum value, initially increases from the surface 9 toward the interface and assumes a (single) maximum value between the surface and the interface 9, 10, and then decreases again such that the value of the ratio S/(Se+S) assumes a second minimum value at the interface 10, where the second minimum value can be equal to the first minimum value, but is, as a rule, different.

In the method according to the invention, etching is optionally possible, for example, with KCN, in order, in particular with copper-rich processing (Cu/(In+Ga)>1), to remove copper selenide and/or copper sulfide.

In the following, with reference to FIG. 2 to FIG. 5, various procedures for producing an absorber 2 made of a pentanary compound semiconductor $Cu(In,Ga)(S,Se)_2$ or made of a quaternary compound semiconductor $Cu(In,Ga)Se_2$ or $Cu(In,Ga)S_2$ in the layer structure 1 of FIG. 1 are reported.

Exemplary Embodiment 1

FIG. 2A illustrates a first procedure for producing the absorber 2 made of the quaternary compound semiconductor $Cu(In,Ga)Se_2$.

First, the first precursor layer 5.1 is deposited on the back electrode layer 4, for example, by sputtering the elements Cu, In, Ga from three element targets. Then, the second precursor layer 6 made of the chalcogen selenium is deposited on the first precursor layer 5.1, which can be done, for example, by thermal vapor deposition (PVD). Then, the third precursor layer 5.2 is deposited by sputtering the elements Cu, In, Ga on the second precursor layer 6. The deposition of the third precursor layer 5.2 corresponds, for example, to the deposition of the first precursor layer 5.1. In this exemplary embodiment, the first precursor layer 5.1 and the third precursor layer 5.2 are identical in structure and in Cu, In, and Ga content such that the first precursor layer 5.1 and the third precursor layer 5.3 have equal amounts of Cu, In, and Ga.

The layer structure 7 comprises, accordingly, the precursor elements or precursor phases Cu—In—Ga/Se/Cu—In—Ga, hereinafter referred to as "Cu—In—Ga/Se/Cu—In—Ga-precursor".

Then, the Cu—In—Ga/Se/Cu—In—Ga-precursor is subjected to rapid thermal processing (RTP). The processing can be done with the supplying of Se gas and/or $H_2Se$ gas to the process chamber 13 containing the layer structure 1. The temperature during the heat treatment is preferably higher than 400° C., particular preferably higher than 500° C. By means of the heat treatment, a reactive conversion of the Cu—In—Ga/Se/Cu—In—Ga-precursor to the quaternary compound semiconductor $Cu(In,Ga)Se_2$, which forms the absorber 2, is effected.

FIG. 2B shows, on the left, the layer structure 1 with absorber 2 and, on the right, the gallium depth profile in the absorber 2 based on the total content of gallium and indium along the direction z perpendicular to the stack sequence of the layer structure 7. The gallium depth profile is configured from the surface 9 of the absorber 2 toward the interface 10 with the body 12 such that the gallium content has a first maximum value at the absorber surface 9, decreases toward the body interface 10 down to a minimum value, and then increases again, and has a second maximum value at the body interface 10.

This can be explained in a simple model by the fact that the selenization front moves in each case from the second selenium-containing precursor layer 6 into the first precursor layer 5.1 and, thus, in the direction of the body interface 10 as well as in the third precursor layer 5.2 and, thus, in the direction of the surface 9 of the absorber 2. This results in gallium enrichment at the body interface 10 to the back electrode 4 and, thus, in a back surface field in the solar cell. Here, "back-surface-field" refers to the increase in the conduction band in the direction of the interface 10 (back contact), caused by the increased amount of Ga in the compound semiconductor. Moreover, the gallium enrichment at the surface 9 of the absorber 2 for the subsequent front contact results in an widening of the bandgap in this region. Both result in an advantageous increase in the open circuit voltage and in a lowering of the temperature coefficient of the thin-film solar cell.

Exemplary Embodiment 2

FIG. 3A illustrates a method for producing an absorber 2 made of a pentanary compound semiconductor Cu(In,Ga)(S,Se)$_2$. In order to avoid unnecessary repetitions, only the differences relative to Exemplary Embodiment 1 are explained and, otherwise, reference is made to the statements made there. The structure of the layer structure 1 and of the Cu—In—Ga/Se/Cu—In—Ga precursor corresponds to that of Exemplary Embodiment 1.

Next, the Cu—In—Ga/Se/Cu—In—Ga precursor is subjected to rapid thermal processing (RTP) in a sulfur-containing atmosphere. To this end, S gas and/or H$_2$S gas is supplied to the process chamber 13 containing the layer structure 1. The temperature during the heat treatment is preferably higher than 400° C., particularly preferably higher than 500° C. By means of the heat treatment, a reactive conversion of the Cu—In—Ga/Se/Cu—In—Ga precursor to form the pentanary compound semiconductor Cu(In,Ga)(S,Se)$_2$, which forms the absorber 2, is effected.

FIG. 3B presents, on the left, the layer structure 1 with a finished absorber 2 and, in the center, the gallium depth profile in the absorber 2 based on the total content of gallium and indium along the direction z. The gallium depth profile is implemented from the surface 9 of the absorber 2 toward the interface 10 with the body 12 such that the gallium content at the absorber surface 9 has a first maximum value, decreases toward the body interface 10 down to a minimum value, and then increases again, and has a second maximum value at the body interface 10. By means of the generated bandgap profile of the absorber 2, an improvement of the efficiency of the thin-film solar cell can be obtained.

The processing of the selenium-containing Cu—In—Ga/Se/Cu—In—Ga precursor in a sulfur-containing atmosphere enables an exchange process of selenium and sulfur between the second precursor layer 6 and the process atmosphere. By this means, the sulfur content and thus the bandgap of the Cu(In,Ga)(S,Se)$_2$ compound semiconductor formed, in addition to the gallium depth profile, can be selectively influenced during the layer forming process. Thus, by a time- and/or concentration-dependent variation of the sulfur content in the reaction gas atmosphere during thermal processing in a desirable manner, a defined sulfur-concentration profile (depth profile) along the layer thickness z of the Cu(In,Ga)(S,Se)$_2$ compound semiconductor formed can be generated. By means of the generated bandgap profile of the absorber 2, a further improvement of the efficiency of the thin-film solar cell can be obtained.

For example, in a special embodiment of the method, in a first (earlier) phase, an inert process gas (e.g., nitrogen (N$_2$) or argon (Ar)) and, in a second (later) process phase, S-Gas and/or H$_2$S-Gas (or a different S-containing gas) can be supplied as a process gas. For example, but not mandatorily, S gas and/or H$_2$S gas could be supplied only in a second half of the time interval of the heat treatment, where the time interval of the supplying can last until the end of the heat treatment or can already end earlier. By supplying H$_2$S gas and/or S gas, a sulfur profile is generated by incorporation of S and subsequent diffusion processes such that the ratio S/(Se+S) has a maximum at the surface 9 and decreases toward the interface 10.

FIG. 3B shows, on the right, the resultant sulfur depth profile in the absorber 2 based on the total content of sulfur and selenium along the direction z.

Alternatively, it would be possible for S gas and/or H$_2$S gas to be supplied during a first (earlier) phase, (for example, but not mandatorily, during the first half of the time interval) of the heat treatment and, optionally, for an inert gas to be supplied in a second (later) process phase in order to selectively influence the sulfur depth profile. For example, two time intervals in which S gas and/or H$_2$S gas is supplied could be interrupted by a time interval in which only inert gas is supplied. However, it would also be conceivable for S gas and/or H$_2$S gas to be supplied during the complete heat treatment.

Exemplary Embodiment 2A

In a variant of Exemplary Embodiment 2, in a first (earlier) phase, the S gas and/or H$_2$S gas is supplied, in a second (later) phase of the heat treatment, the inert gas is supplied, and in a third (even later) phase, the S gas and/or H$_2$S gas is supplied, in order to selectively influence the sulfur depth profile.

FIG. 3C shows, on the right, the resultant sulfur depth profile in the absorber 2 based on the total content of sulfur and selenium along the direction z. The sulfur depth profile has a maximum at the surface 9 and the interface 10 of the absorber 2.

The increased bandgap due to the gallium enrichment at the surface 9 and the interface 10 results, in the thin-film solar cell (20), in an increase in the open circuit voltage and the efficiency. On the other hand, the height of the short circuit current is determined by the minimum of the bandgap in the interior of the absorber 2. In combination, the double maximum structure in the gallium content and the sulfur content advantageously results in an increase in the efficiency of the thin-film solar cell.

Exemplary Embodiment 3

FIG. 4A illustrates another method for producing the absorber 2 made of the pentanary compound semiconductor Cu(In,Ga)(S,Se)$_2$. In order to avoid unnecessary repetitions, only the differences relative to Exemplary Embodiment 2 are explained and, otherwise, reference is made to the statements made there.

According to it, instead of deposition of Se for producing the second precursor layer 6, deposition of the chalcogen S is provided such that the layer structure 7 includes the precursor elements Cu—In—Ga/S/Cu—In—Ga (Cu—In—Ga/S/Cu—In—Ga precursor). The Cu—In—Ga/S/Cu—In—Ga precursor is subjected to rapid thermal processing in a Se-containing atmosphere. To this end, Se gas and/or H$_2$Se gas is supplied to the process chamber 13 containing the layer structure 1. By means of the heat treatment, a reactive conversion of the Cu—In—Ga/S/Cu—In—Ga precursor to form the pentanary compound semiconductor Cu(In,Ga)(S,Se)$_2$, which forms the absorber 2, is effected.

The processing of the S-containing Cu—In—Ga/S/Cu—In—Ga precursor in a Se-containing atmosphere enables an exchange process of S and Se between the second precursor layer 6 and the gas phase. By this means, the sulfur content of the Cu(In,Ga)(S,Se)$_2$ compound semiconductor formed can be selectively influenced during the layer forming process.

For example, in a special embodiment of the method, in a second (later) phase, Se-Gas and/or H$_2$Se-Gas (or a different Se-containing gas) and, in a first (earlier) process phase, an inert gas (e.g., nitrogen (N$_2$) or argon (Ar)) can be supplied as process gas. For example, but not mandatorily, Se gas and/or H$_2$Se gas could be supplied only in a second half of the time interval of the heat treatment. By supplying H$_2$Se gas and/or Se gas, a sulfur profile is generated by incorporation of Se and subsequent diffusion processes such that the ratio S/(Se+S) has a minimum at the surface 9 and increases toward the interface 10.

FIG. 4B shows, on the left, the layer structure 1 with a finished absorber 2, in the center, the resultant gallium depth profile along the direction z along the absorber 2 and, on the right, the resultant sulfur depth profile.

Exemplary Embodiment 4

FIG. 5A illustrates another method for producing the absorber 2 made of the pentanary compound semiconductor Cu(In,Ga)(S,Se)$_2$. In order to avoid unnecessary repetitions, only the differences relative to Exemplary Embodiment 2 are explained and, otherwise, reference is made to the statements made there.

In contrast to Exemplary Embodiment 2, the starting point is not a Cu—In—Ga/Se/Cu—In—Ga precursor wherein the first precursor layer 5.1 and the third precursor layer 5.2 contain the same structure and the same amounts of Cu, In, and Ga.

FIG. 5 A shows a layer structure 1 wherein roughly 80% of the total amount of Cu, In, Ga is arranged in the first precursor layer 5.1 and roughly 20% are arranged in the third precursor layer 5.2. The quantity ratios of Cu, In, Ga are set by the respective layer thicknesses. The heat treatment is done, for example, in a sulfur-containing process atmosphere, as presented under Exemplary Embodiment 2.

FIG. 5 B shows the gallium depth profile of the resultant absorber 2. The gallium depth profile has a maximum based on the total content of gallium and indium at the interface with the body 12 and at the surface 9 of the absorber 2. The minimum in the gallium content is shifted to the surface 9 of the absorber 2 and is roughly 20% of the absorber thickness.

Exemplary Embodiment 5

FIG. 6 depicts an exemplary embodiment of a thin-film solar cell according to the invention 20. The thin-film solar cell 20 has a substrate 3, which, for example, comprises a 2.1-mm-thick soda lime glass panel. A diffusion barrier layer 3.1, which prevents the diffusion of sodium out of the substrate 3 into the semiconductor layers of the thin-film solar cell 20, is arranged on the substrate 3. The diffusion barrier layer 3.1 is made, for example, of a 100-nm-thick silicon nitride layer.

A back electrode layer 4 is arranged on the diffusion barrier layer 3.1. The back electrode layer 4 includes, for example, a 450-nm-thick molybdenum layer. In an advantageous improvement of the thin-film solar cell 20 according to the invention, the back electrode layer 4 can be a multilayer system, wherein, for example, a titanium nitride layer is arranged between two individual layers made of molybdenum.

A back electrode transition layer 4.1, which contains molybdenum and—depending on absorber 2—sulfur and/or selenium, is arranged on the back electrode layer 4. The back electrode transition layer 4.1 has, for example, a thickness of 50 nm to 500 nm.

An absorber 2 according to the invention is arranged on the back electrode transition layer 4.1. The absorber 2 is made of a quaternary compound semiconductor Cu(In,Ga)Se$_2$, a quaternary compound semiconductor Cu(In,Ga)S$_2$, or a pentanary compound semiconductor Cu(In,Ga)(S,Se)$_2$. The layer thickness of the absorber 2 is, for example, from 1 μm to 2 μm. The absorber 2 has a bandgap of a minimum of 1.0 eV. The absorber 2 has an interface 10 with the body 12, which is made of substrate 3, diffusion barrier layer 3.1, back electrode layer 4, and back electrode transition layer 4.1.

FIG. 7 depicts an exemplary embodiment of the process steps according to the invention for producing the absorber 2 using a flowchart. The production of the absorber is done, for example, by the following process steps:

In a first step, the first precursor layer 5.1 made of Cu, In, and Ga is deposited on the back electrode transition layer 4.1. For this, for example, copper and gallium are deposited by sputtering from a target with an atomic proportion of 85% Cu and 25% Ga and indium from an indium target by sputtering. The copper-gallium target and the indium target have, for example, a high purity of more than 99.99% (≥4N).

The first precursor layer 5.1 has, for example, a layer thickness of roughly 400 nm, which corresponds to a total mass density of Cu, In, and Ga of roughly 0.2 mg/cm$^2$ to 0.25 mg/cm$^2$. This is applied, for example, by three double layers of Cu/Ga and In.

Then, the desired amount of selenium in the second precursor layer 6 is deposited onto the first precursor layer 5.1, for example, by thermal vapor deposition. The layer thickness of the second precursor layer 6 is, for example, 1000 nm to 1500 nm selenium.

Then, the third precursor layer 5.2 is deposited onto the second precursor layer 6. The third precursor layer 5.2 contains, for example, a double layer of Cu/Ga and In or a double layer of In and Cu/Ga.

During the deposition of the precursor layers 5.1, 6, 5.2, a dopant addition of, for example, sodium, can be done.

In a second step, the precursor layers 5.1, 6, 5.2 are converted by rapid heating to temperatures of about 500° C. into a compound semiconductor having chalcopyrite structure. The heat treatment can be done, for example, in a chalcogen-containing atmosphere and, in particular, in a sulfur-containing atmosphere (for example, by H$_2$S addition or S gas). The resultant compound semiconductor forms the absorber 2 of the thin-film solar cell 20.

The absorber 2 according to the invention has, in this case, a defined gallium depth profile that is configured such that the gallium content has a first maximum value at the surface 9, decreases toward the interface 10 down to a minimum value, and then increases again, and has a second maximum value at the interface 10.

A buffer layer 14 is arranged on the surface 9 of the absorber 2. The buffer layer 14 includes, for example, an indium sulfide layer and an intrinsically doped zinc oxide layer. A front electrode layer 15, for example, made of aluminum-doped zinc oxide is arranged on the buffer layer 14. The thickness of the front electrode layer 15 is, for example, 1200 nm.

FIG. 8 depicts gallium and indium depth profiles measured by high-resolution time-of-flight secondary ion mass spectrometry (ToF-SIMS) of three differently prepared absorbers 2. FIG. 8 i) and FIG. 8 ii) show comparative examples and FIG. 8 iii) shows an example according to the invention.

The absorbers 2 tested were deposited on a back electrode layer 4. The metallic precursor layers were sputtered layerwise from a copper-gallium target and an indium target. The chalcogen-containing precursor layer was produced by thermal vapor deposition of selenium. The precursor layers were not doped with sodium. The heat treatment for the formation of the compound semiconductor was done without addition of sulfur in the process chamber.

Table 1 presents an overview of the precursors that were deposited, processed, and then characterized.

TABLE 1

|  | First precursor layer | Second precursor layer | Third precursor layer |
|---|---|---|---|
| Comparative Example 1 | Cu/In/Ga (100%) | Se | — |
| Comparative Example 2 | Se | Cu/In/Ga (100%) | — |
| Example according to the invention | Cu/In/Ga (50%) | Se | Cu/In/Ga (50%) |

In Comparative Example 1, a Cu/In/Ga—Se precursor was investigated; in Comparative Example 2, a Se—Cu/In/Ga precursor; and in the Example, a Cu/In/Ga—Se—Cu/In/Ga precursor according to the invention. In the Cu/In/Ga—Se—Cu/In/Ga precursor according to the invention, the layer thickness of an individual Cu/In/Ga precursor layer is roughly that of the Cu/In/Ga layers of the Comparative Examples. Thus, equal quantity ratios of the metal components in the compound semiconductor could be guaranteed.

The results of a TOF-SIMS analysis of the absorber layers thus prepared are presented in FIG. 8 i)-iii): In FIG. 8 i)-iii), on the horizontal axis, in each case, the sputter depth normed to the thickness of the absorber 2 is plotted, with the analysis beginning at the surface 9 of the absorber 2. The absorber 2 corresponds to the region 0 to 1 on the horizontal axis and the back electrode layer 4 corresponds to the region with values>1. On the vertical axis, the intensity of the gallium- or indium counts is plotted.

FIG. 8 i) depicts the depth profile analysis with TOF-SIMS for the Comparative Example 1 according to the prior art, where the absorber 2 was produced starting from a Cu/In/Ga—Se precursor. The depth profile analysis shows a minimum in the gallium content at the surface 9 of the absorber 2 (sputter depth=0). With increasing sputter depth, the gallium content increases and reaches its maximum at a sputter depth of 1, which corresponds to the interface 10 to the back electrode 4. At the same time, the indium content has a maximum at the surface 9 of the absorber 2 (sputter depth=0). With increasing sputter depth, the indium content decreases and reaches a minimum at a sputter depth of 1, which corresponds roughly to the interface 10 to the back electrode 4.

FIG. 8 ii) depicts the depth profile analysis with TOF-SIMS for the Comparative Example 2, where the absorber 2 was produced starting from a Se—Cu/In/Ga precursor. The depth profile analysis shows a maximum in the gallium content at the surface 9 of the absorber 2 (sputter depth=0). With increasing sputter depth, the gallium content decreases and reaches its minimum at a sputter depth of 1, which corresponds to the interface 10 to the back electrode 4. At the same time, the indium content has a minimum at the surface 9 of the absorber 2 (sputter depth=0). With increasing sputter depth, the indium content increases and reaches a maximum at a sputter depth of 1, which corresponds roughly to the interface 10 to the back electrode 4.

FIG. 8 iii) depicts the depth profile analysis with TOF-SIMS for the Example according to the invention, where the absorber 2 was produced starting from a Cu/In/Ga—Se—Cu/In/Ga precursor. The depth profile analysis shows a maximum in the gallium content at the surface 9 of the absorber 2 (sputter depth=0). With increasing sputter depth, the gallium content decreases and reaches a minimum at sputter depths that correspond to roughly half the thickness of the absorber 2. Then, the gallium content increases again and reaches a second maximum at a sputter depth of roughly 1, which corresponds roughly to the interface 10 to the back electrode 4. At the same time, the indium content has a minimum at the surface 9 of the absorber 2 (sputter depth=0). With increasing sputter depth, the indium content decreases and reaches a maximum at sputter depths that correspond roughly to half the thickness of the absorber 2. For greater sputter depths, the indium content decreases again and reaches a minimum at a sputter depth of 1, which corresponds to the interface 10 to the back electrode 4.

The layer structure according to the invention of the Cu/In/Ga—Se—Cu/In/Ga precursor thus results in the desired gallium double profile with a gallium maximum at the surface 9 and at the interface 10 of the absorber 2.

The formation of the gallium profile according to the invention can be understood in the context of the following model: gallium is, compared to selenium, clearly less reactive than, for example, copper or indium. In a Cu/In/Ga—Se—Cu/In/Ga precursor, during the heat treatment process, the liquid selenium reacts with the Cu—, In—, and Ga components to form binary selenides. This reaction begins in the Cu/In/Ga—Se—Cu/In/Ga precursor of the second selenium-containing precursor layer 6 and continues downward into the first precursor layer 5.1 and upward into the third precursor layer 5.2. Due to the existing differences in the selenization kinetics of the metals Cu, In, Ga, there is an enrichment of Ga-containing metal alloys on the sides facing away from the selenium. No complete interdiffusion of gallium occurs and there remains a compound semiconductor with an indium-rich center region and maxima in the gallium content at the surface 9 and the interface 10.

Thus, with the present invention it is possible for the first time to set a gallium double profile with a gallium maximum on the top and the bottom of the absorber using a two-step process of layer deposition and heat treatment (RTP). This can be set combined with a sulfur profile, for example, by means of $H_2S$ supply during the heat treatment process. The bandgap curve in the absorber 2 optimized by the gallium double profile and, additionally, by the sulfur profile results in a high open circuit voltage in combination with a high short-circuit current intensity. Both result in increased efficiency of the thin-film solar cell. Also, the temperature coefficient of the thin-film solar cell is advantageously reduced.

This was unexpected and surprising for the person skilled in the art.

LIST OF REFERENCE CHARACTERS 1 layer structure
2 compound semiconductor, absorber 3 substrate
3.1 diffusion barrier layer
4 back electrode layer
4.1 back electrode transition layer
5.1 first precursor layer
5.2 third precursor layer
6 second precursor layer
7 layer structure
8 arrow
9 surface
10 interface
11 precursor layer stack
12 body
13 process chamber
14 buffer layer
15 front electrode layer
20 thin-film solar cell
z layer thickness

The invention claimed is:

1. Method for producing a pentanary compound semiconductor $Cu(In,Ga)(S,Se)_2$, comprising the following steps:
producing at least one precursor layer stack, consisting of a first precursor layer, a second precursor layer, and a third precursor layer, wherein, in a first stage, the first precursor layer is produced by depositing the metals copper, indium, and gallium onto a body, and, in a second stage, the second precursor layer is produced by depositing at least one chalcogen, selected from sulfur and selenium, onto the first precursor layer, and, in a third stage, the third precursor layer is produced by depositing the metals copper, indium, and gallium onto the second precursor layer;
heat treating the at least one precursor layer stack in a process chamber such that the metals of the first precursor layer, the at least one chalcogen of the second precursor layer, and the metals of the third precursor layer are reactively converted to form the compound semiconductor, wherein at least one process gas is supplied to the process chamber at least intermittently during the heat treatment of the at least one precursor layer stack, wherein at least sulfur and/or at least one sulfur-containing compound is contained in the process gas, wherein
the second precursor layer is produced by depositing selenium onto the first precursor layer,
wherein a defined sulfur depth profile is formed in the pentanary compound semiconductor by the at least one process gas,
wherein the sulfur depth profile from one surface of the compound semiconductor to an interface with the body is configured such that
the sulfur content has a minimum value at the surface, increases toward the interface and has a maximum value at the interface; or
the sulfur content has a first maximum value at the surface, decreases down to a minimum value toward the interface, and then increases again, and has a second maximum value at the interface; or
the sulfur content has a first minimum value at the surface, increases toward the interface up to a maximum value, and then decreases again, and has a second minimum value at the interface,
wherein the gallium depth profile from one surface of the compound semiconductor to an interface with the body is configured such that the gallium content has a first maximum value at the surface, decreases toward the interface down to a minimum value, and then increases again, and has a second maximum value at the interface.

2. Method according to claim 1, wherein
the first precursor layer and/or the third precursor layer are deposited by sputtering of one or a plurality of individual layers from a copper-gallium alloy target and an indium target or from a copper-indium alloy target and a copper-gallium alloy target or from a copper-gallium-indium alloy target, and/or
the second precursor layer made of individual layers of the chalcogen selenium is deposited.

3. Method according to claim 1, wherein a fourth precursor layer is deposited onto the third precursor layer, and the fourth precursor layer contains at least one chalcogen, selected from sulfur and selenium, and the fourth precursor layer is thinner than the third precursor layer.

4. Method according to claim 1, wherein the precursor layer stack is deposited several times in succession.

5. Method according to claim 1, wherein the gallium depth profile is configured such that the absolute change in the gallium content is at least 20% at least over a portion of the depth profile.

6. Method according to claim 1, wherein the sulfur depth profile is configured such that an absolute change of the sulfur content is at least 20% at least over a portion of the depth profile.

7. Thin-film solar cell having an absorber made of a pentanary compound semiconductor $Cu(In,Ga)(S,Se)_2$ arranged on a body, wherein the compound semiconductor has a defined gallium depth profile from one surface of the compound semiconductor to an interface with the body, wherein the gallium depth profile is configured such that the gallium content has a first maximum value at the surface, decreases down to a minimum value toward the interface and then increases again, and has a second maximum value at the interface,
wherein the compound semiconductor has a defined sulfur depth profile from one surface (9) of the compound semiconductor to an interface with the body
wherein the sulfur depth profile is configured such that
the sulfur content has a minimum value at the surface, increases toward the interface, and has a maximum value at the interface; or
the sulfur content has a first maximum value at the surface, decreases down to a minimum value toward the interface, and then increases again, and has a second maximum value at the interface; or
the sulfur content has a first minimum value at the surface, increases up to a maximum value toward the interface, and has a second minimum value at the interface.

8. Method according to claim 1, wherein for producing the pentanary compound semiconductor $Cu(In,Ga)(S,Se)_2$, the second precursor layer is produced by depositing the chalcogens sulfur and selenium onto the first precursor layer.

9. Method according to claim 1, wherein for producing the pentanary compound semiconductor $Cu(In,Ga)(S,Se)_2$, at least selenium and/or at least one selenium-containing compound is contained in the process gas.

10. Method according to claim 2, wherein the second precursor layer made of individual layers of the chalcogens selenium and sulfur is deposited.

* * * * *